United States Patent
Jia et al.

(10) Patent No.: US 11,923,019 B2
(45) Date of Patent: Mar. 5, 2024

(54) DATA RETENTION RELIABILITY

(71) Applicant: SanDisk Technologies LLC, Addison, TX (US)

(72) Inventors: Xiaojia Jia, San Jose, CA (US); Swaroop Kaza, San Jose, CA (US); Laidong Wang, San Jose, CA (US); Jiacen Guo, Sunnyvale, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 167 days.

(21) Appl. No.: 17/670,821

(22) Filed: Feb. 14, 2022

(65) Prior Publication Data

US 2023/0260583 A1 Aug. 17, 2023

(51) Int. Cl.
*G11C 16/34* (2006.01)
*G11C 16/10* (2006.01)
*G11C 16/24* (2006.01)
*G11C 16/26* (2006.01)

(52) U.S. Cl.
CPC ........ *G11C 16/3459* (2013.01); *G11C 16/102* (2013.01); *G11C 16/24* (2013.01); *G11C 16/26* (2013.01); *G11C 16/3404* (2013.01)

(58) Field of Classification Search
None
See application file for complete search history.

(56) References Cited

U.S. PATENT DOCUMENTS

| | | | |
|---|---|---|---|
| 7,095,654 B2 | 8/2006 | Quader | |
| 7,130,210 B2 | 10/2006 | Bathul | |
| 7,447,068 B2 | 11/2008 | Tsai | |
| 8,228,741 B2 | 7/2012 | Li | |
| 8,456,915 B2 | 6/2013 | Chen | |
| 11,508,434 B2* | 11/2022 | Choi | G11C 16/3459 |
| 2012/0170363 A1 | 7/2012 | Tsai | |
| 2020/0202964 A1* | 6/2020 | Sako | G11C 16/24 |

* cited by examiner

*Primary Examiner* — Tan T. Nguyen
(74) *Attorney, Agent, or Firm* — Hector A. Agdeppa; SHEPPARD, MULLIN, RICHTER & HAMPTON LLP

(57) ABSTRACT

The present disclosure provides for improving data retention reliability. During a programming operation associated with a memory cell, after the memory cell passes verification of a first verification voltage level, a second verification voltage level can be applied to the memory cell. Based on a comparison of the voltage in the memory cell with the second verification voltage level, a bit line voltage may be applied. Based on the applied bit line voltage, fast bits associated with the memory cell can be upshifted to an upper portion of a final voltage distribution associated with the programming operation. Upshifting the fast bits counteracts the downshifting effect in a final voltage distribution that may be caused by charge leakage or electron loss.

20 Claims, 16 Drawing Sheets

DATA RETENTION RELIABILITY

BACKGROUND

Semiconductor memory devices are increasingly used in various technologies. For example, non-volatile semiconductor memory is often used in various electronic devices, such as cellular telephones, digital cameras, personal digital assistants, mobile computing devices, non-mobile computing devices and other devices. A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
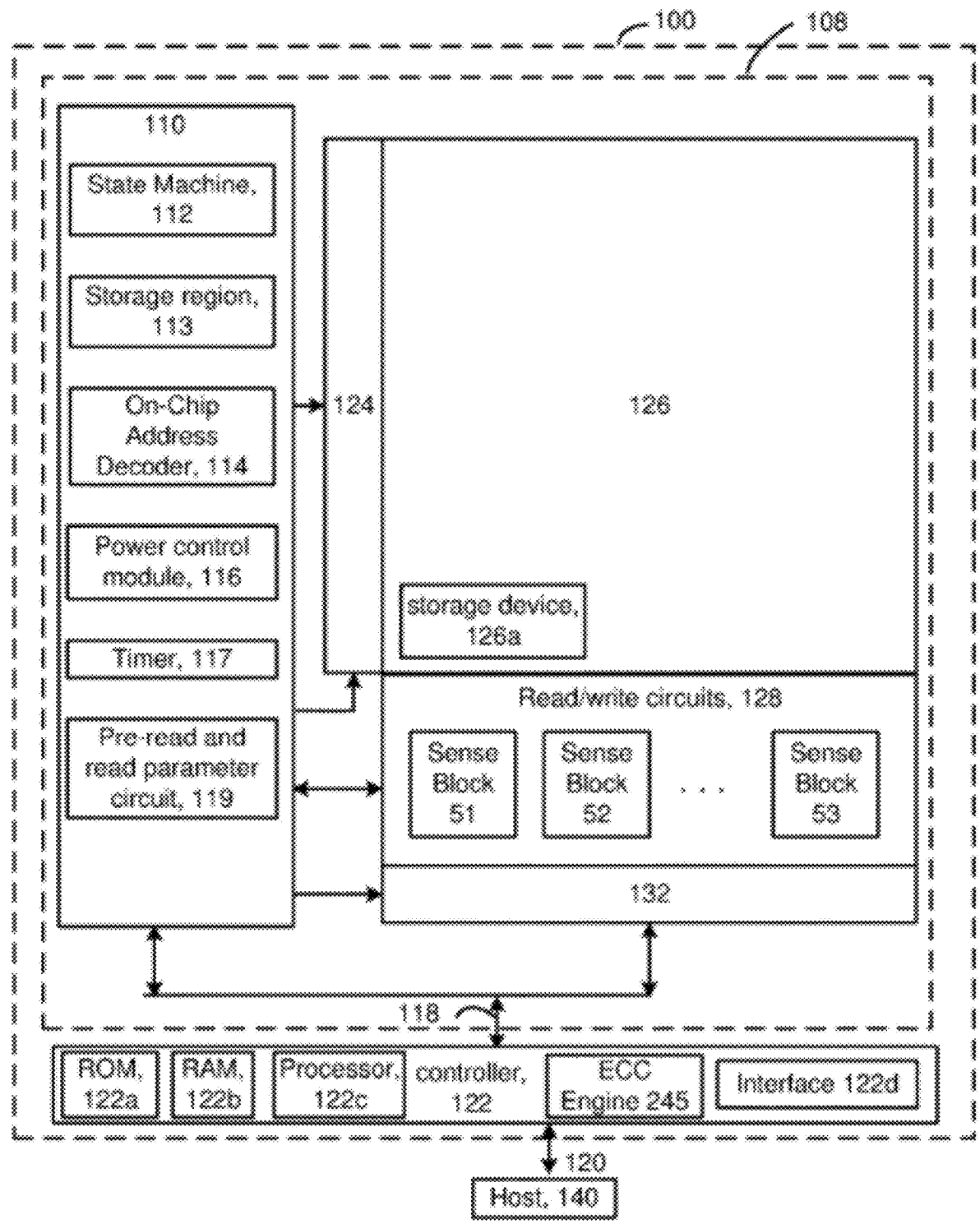
FIG. 1 is a block diagram of an example memory device.

The figures are not exhaustive and do not limit the present disclosure to the precise form disclosed.

DETAILED DESCRIPTION

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

During a programming operation (e.g., by one or more read/write circuits), the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations. Verify operations may be performed (e.g., by one or more sense amplifiers) after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Data retention errors can occur during a programming operation due to charge leakage, or electron loss. During a programming operation, a memory cell may be charged with a program voltage and subsequently leak charge, or suffer electron loss. This charge leakage may serve to downshift bits associated with the program voltage. This downshifting of bits may cause a widening of a voltage distribution associated with the programming operation. Further, because the voltage distribution has been widened due to the downshift of bits, the margin between voltage distributions associated with programming sequences becomes smaller. This is sometimes referred to as a data retention effect, and this widening of the voltage distribution and the shrinking of the margin between voltage distributions is a source of programming error in memory cells. As these memory cells age, the widening of the voltage distribution and the shrinking of the margin between voltage distributions due to charge leakage, or electron loss, becomes increasingly prevalent. Thus, memory devices continue to face challenges associated with programming errors due to charge leakage or electron loss.

Accordingly, the present disclosure provides for improving data retention reliability. In various embodiments, during a programming operation associated with a memory cell, after the memory cell passes verification of a first verification voltage level, a second verification voltage level can be applied to the memory cell. Based on a comparison of the voltage in the memory cell with the second verification voltage level, a bit line voltage may be applied. Based on the applied bit line voltage, fast bits associated with the memory cell can be upshifted to an upper portion of a final voltage distribution associated with the programming operation. Upshifting the fast bits counteracts the downshifting effect in a final voltage distribution that may be caused by charge leakage or electron loss. Thus, the present disclosure provides improvements that address challenges associated with programming errors due to charge leakage or electron loss.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a power control module 116 (power control circuit), a timer 117, and a pre-read and read parameter circuit 119. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach. The timer 117 can keep track of a duration since a last read operation for a block. For example, this can be a last successful read operation in which there was no uncorrectable error. A timer can track this duration for each block in the memory device, for example. See also FIG. 12E. The pre-read and read parameter circuit can include, e.g., voltages for a selected word line, adjacent unselected word lines, non-adjacent unselected word lines, dummy word lines, select gate transistors, bit lines and source lines, and durations for applying these voltages, in a pre-read or read operation. The timer and pre-read and read parameter circuit may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements is formed, or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
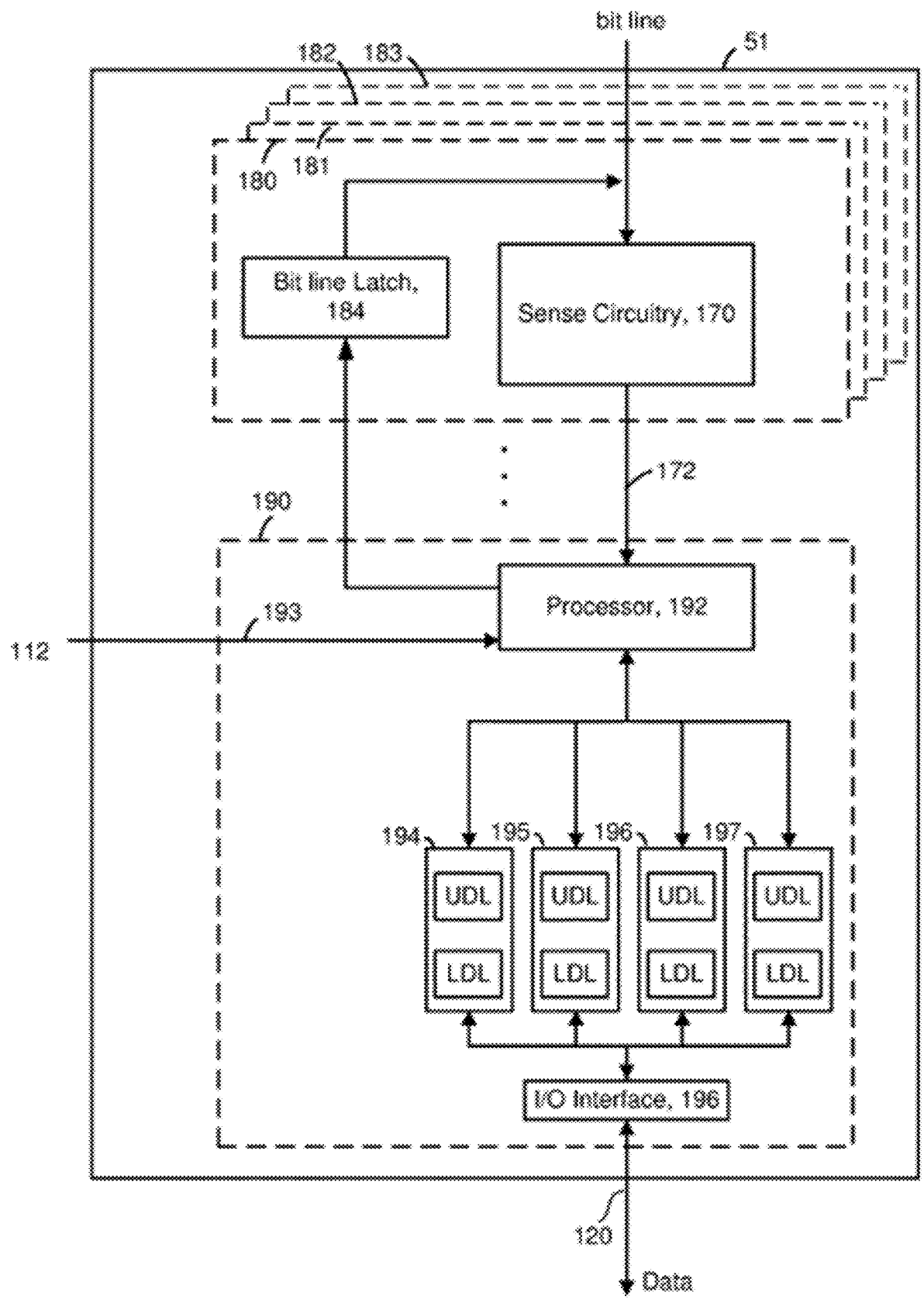
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 180-183 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements.

The sense circuit 180, as an example, comprises sense circuitry 170 that performs sensing by determining whether a conduction current in a connected bit line is above or below a predetermined threshold level. Sense circuit 180 also includes a bit line latch 184 that is used to set a voltage condition on the connected bit line. For example, a predetermined state latched in the bit line latch will result in the connected bit line being pulled to a state designating program inhibit (e.g., 1.5-3 V). As an example, a flag=0 can inhibit programming, while flag=1 does not inhibit programming.

The managing circuit 190 comprises a processor 192, four example sets of data latches 194-197 and an I/O Interface 196 coupled between the set of data latches 194 and data bus 120. One set of data latches, e.g., LDL and UDL, can be provided for each sense circuit. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element.

The processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense circuit 180 may trip at one of these voltages and a corresponding output will be provided from sense circuit 180 to processor 192 via bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197. In another embodiment of the managing circuit 190, bit line latch serves double duty, both as a latch for latching the output of the sense circuit 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL and UDL latches, in a two-bit per storage element implementation. In a three-bit per storage element implementation, an additional data latch may be used. The program operation, under the control of the state machine, comprises a series of programming voltage pulses applied to the control gates of the addressed storage elements. Each program voltage is followed by a read back (verify) to determine if the storage element has been programmed to the desired memory state. In some cases, processor 192 monitors the read back memory state relative to the desired memory state. When the two are in agreement, the processor 192 sets the bit line latch so as to cause the bit line to be pulled to a state designating program inhibit. This inhibits the storage element coupled to the bit line from further programming even if program pulses appear on its control gate. In other embodiments the processor initially loads the bit line latch and the sense circuitry sets it to an inhibit value during the verify process.

Each set of data latches 194-197 may be implemented as a stack of data latches for each sense circuit. In one embodiment, there are three data latches per sense circuit 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated storage element has reached certain mileposts in program operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

Figure 3:
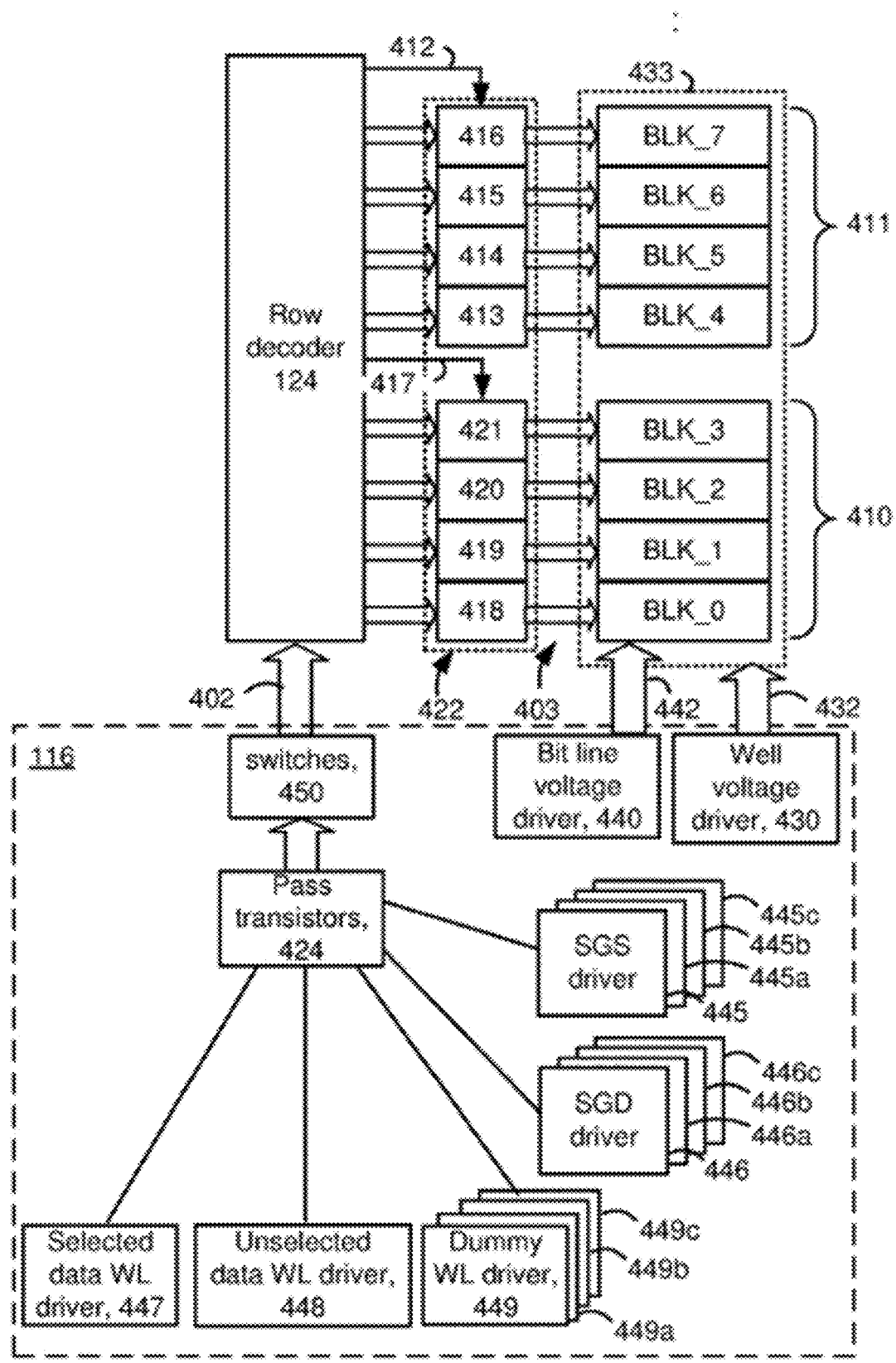
FIG. 3 depicts an example implementation of the power control module 116 of FIG. 1 for providing voltages to blocks of memory cells.

FIG. 3 depicts an example implementation of the power control module 116 of FIG. 1 for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of blocks are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively. See further details in FIG. 4.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation, a driver 448 for unselected data word lines, and dummy word line drivers 449-449c which provide voltages on dummy word lines. For example, the dummy word line drivers 449, 449a, 449b and 449c may provide voltages on the control gate layers or word line layers WLDD0, WLDD1, WLDS1 and WLDS0, respectively, in FIG. 6A, during a refresh operation as described herein.

The voltage drivers can also include separate SGS and SGD drivers for each sub-block. For example, SGS drivers 445, 445a, 445b and 445c, and SGD drivers 446, 446a, 446b and 446c can be provided for SB0, SB1, SB2 and SB3, respectively, such as in FIGS. 7, 8A and 8B. In another option, one SGS driver is common to the different sub-blocks in a block.

The various components, including the row decoder, may receive commands from a controller such as the state machine 112 or the controller 122 to perform the functions described herein.

The well voltage driver 430 provides a voltage Vsl to the well region 611a (see FIGS. 6A and 8B) in the substrate, via control lines 432. In one approach, the well region 433 is common to the blocks. A set of bit lines 442 is also shared by the blocks. A bit line voltage driver 440 provides voltages to the bit lines. In a stacked memory device such as depicted in FIGS. 4 to 8B, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach.

Figure 4:
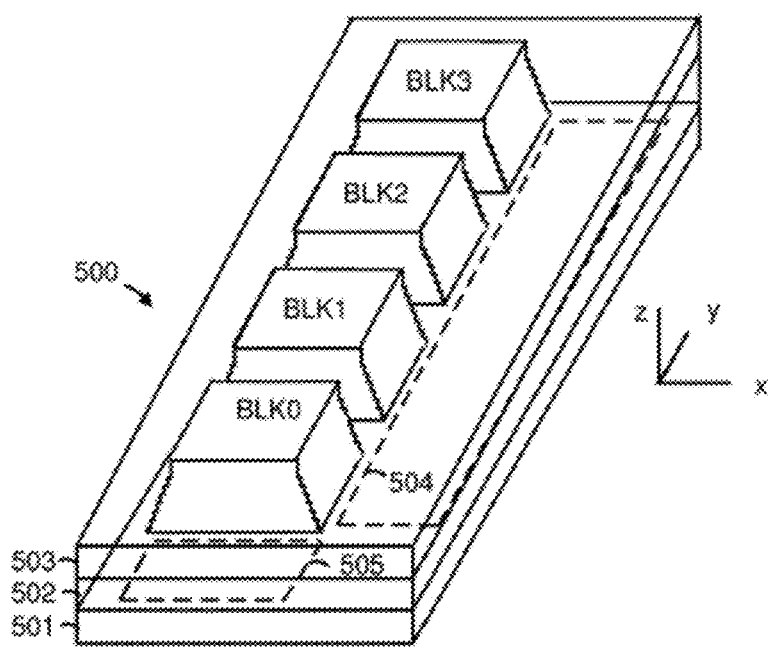
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
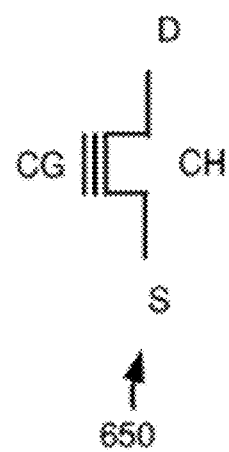
FIG. 5 depicts an example transistor 650.

FIG. 5 depicts an example transistor 650. The transistor comprises a control gate CG, a drain D, a source S, and a channel CH and may represent a memory cell or a select gate transistor, for example.

Figure 6A:
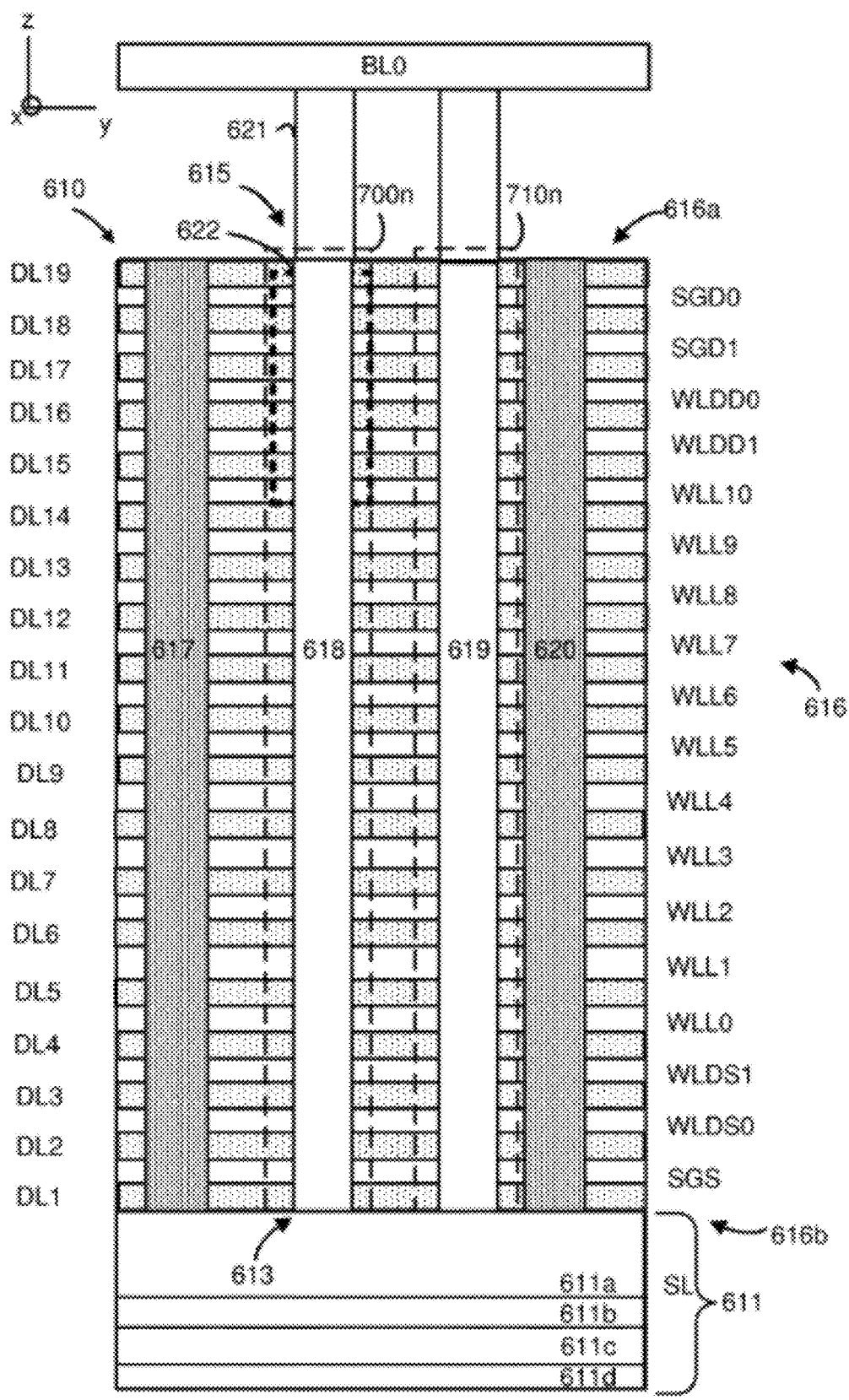
FIG. 6A depicts an example cross-sectional view of a portion of the block BLK0 of FIG. 4.

FIG. 6A depicts an example cross-sectional view of a portion of the block BLK0 of FIG. 4. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and eleven data word line layers (or data word lines) WLL0-WLL10. WLL0 is a source side data word line and WLDS1 is a dummy word line layer which is adjacent to the source side data word line. WLDS0 is another dummy word line layer which is adjacent to WLDS1. WLL10 is a drain side data word line and WLDD1 is a dummy word line layer which is adjacent to the drain side data word line. WLDD0 is another dummy word line layer which is adjacent to WLDD1. The dielectric layers are labelled as DL1-1L19. Further, regions of the stack which comprise NAND strings 700n and 710n are depicted. Each NAND string encompasses a memory hole 618 or 619 which is filled with materials which form memory cells adjacent to the word lines. Region 622 of the stack is shown in greater detail in FIG. 6B.

The stack includes a substrate 611. In one approach, a portion of the source line SL comprises a well region 611a as an n-type source diffusion layer or well in the substrate. The well region is in contact with a source end of each string of memory cells in a block. An erase pulse may be applied to this layer in an erase operation The n-type well region 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NAND string 700n has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

Figure 6B:
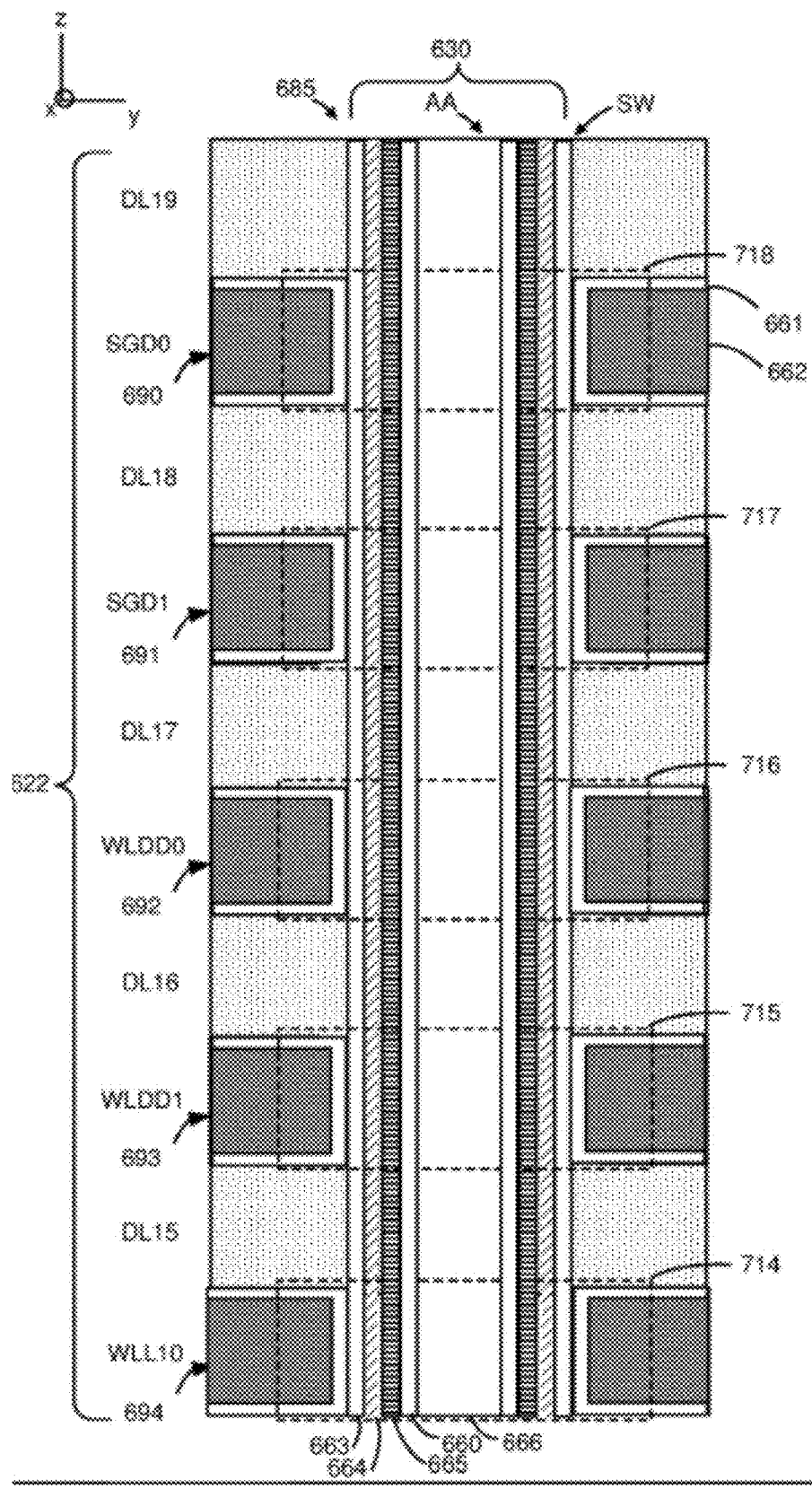
FIG. 6B depicts a close-up view of the region 622 of the stack of FIG. 6A.

FIG. 6B depicts a close-up view of the region 622 of the stack of FIG. 6A. Memory cells are formed at the different levels of the stack at the intersection of a word line layer and a memory hole. In this example, SGD transistors 718 and 717 are provided above dummy memory cells 716 and 715 and a data memory cell 714. These SGD transistors are at the drain end of the NAND string.

A number of layers can be deposited along the sidewall (SW) of the memory hole 630 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665 (e.g., a gate oxide), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively. The channel 700a extends continuously in the NAND strings 700n from the SGS transistor 701 to the SGD transistors 717 and 718. The channel 700a is continuous in that it is uninterrupted and can therefore provide a continuous conductive path in the NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 6C:
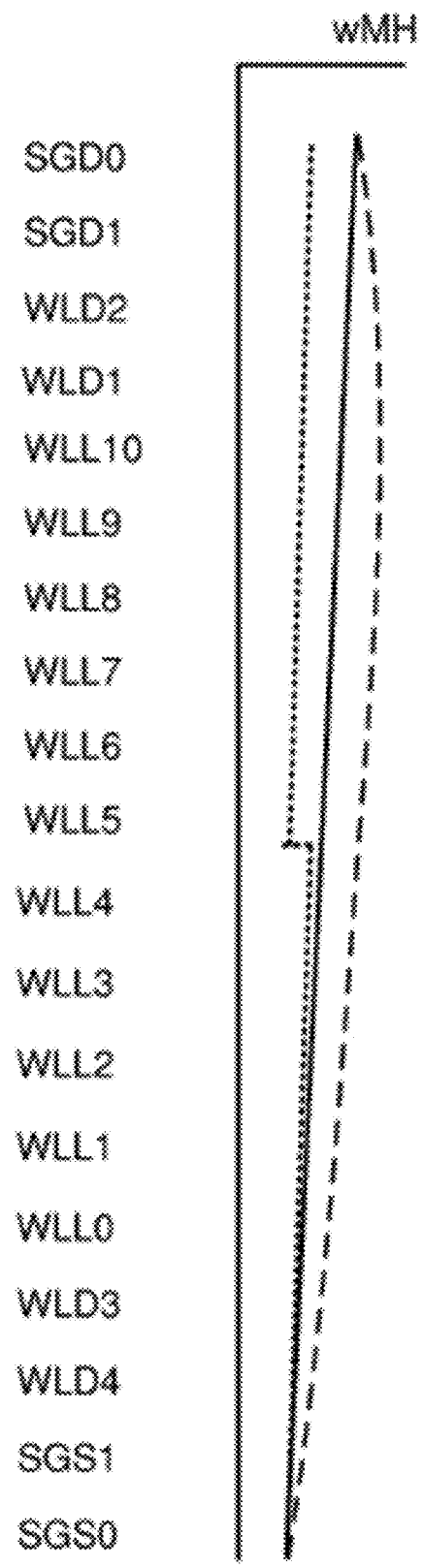
FIG. 6C depicts a plot of memory hole/pillar diameter in the stack of FIG. 6A.

FIG. 6C depicts a plot of memory hole/pillar diameter in the stack of FIG. 6A. The vertical axis is aligned with the stack of FIG. 4 and depicts a width (wMH), e.g., diameter, of the pillars formed by materials in the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (solid line in FIG. 6C). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line in FIG. 6C). For example, the memory hole width is a maximum at the level of WL9 in the stack, in this example. The memory hole width is slightly smaller at the level of WL10, and progressively smaller at the levels of WL8 to WL0.

Due to the non-uniformity in the diameter of the memory hole and resulting pillar, the programming and erase speed of the memory cells can vary based on their position along the memory hole. With a relatively smaller diameter at the bottom of a memory hole, the electric field across the tunnel oxide is relatively stronger, so that the programming and erase speed is higher for memory cells in word lines adjacent to the relatively smaller diameter portion of the memory holes.

In another possible implementation, represented by the short dashed line, the stack is fabricated in two tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

Figure 7:
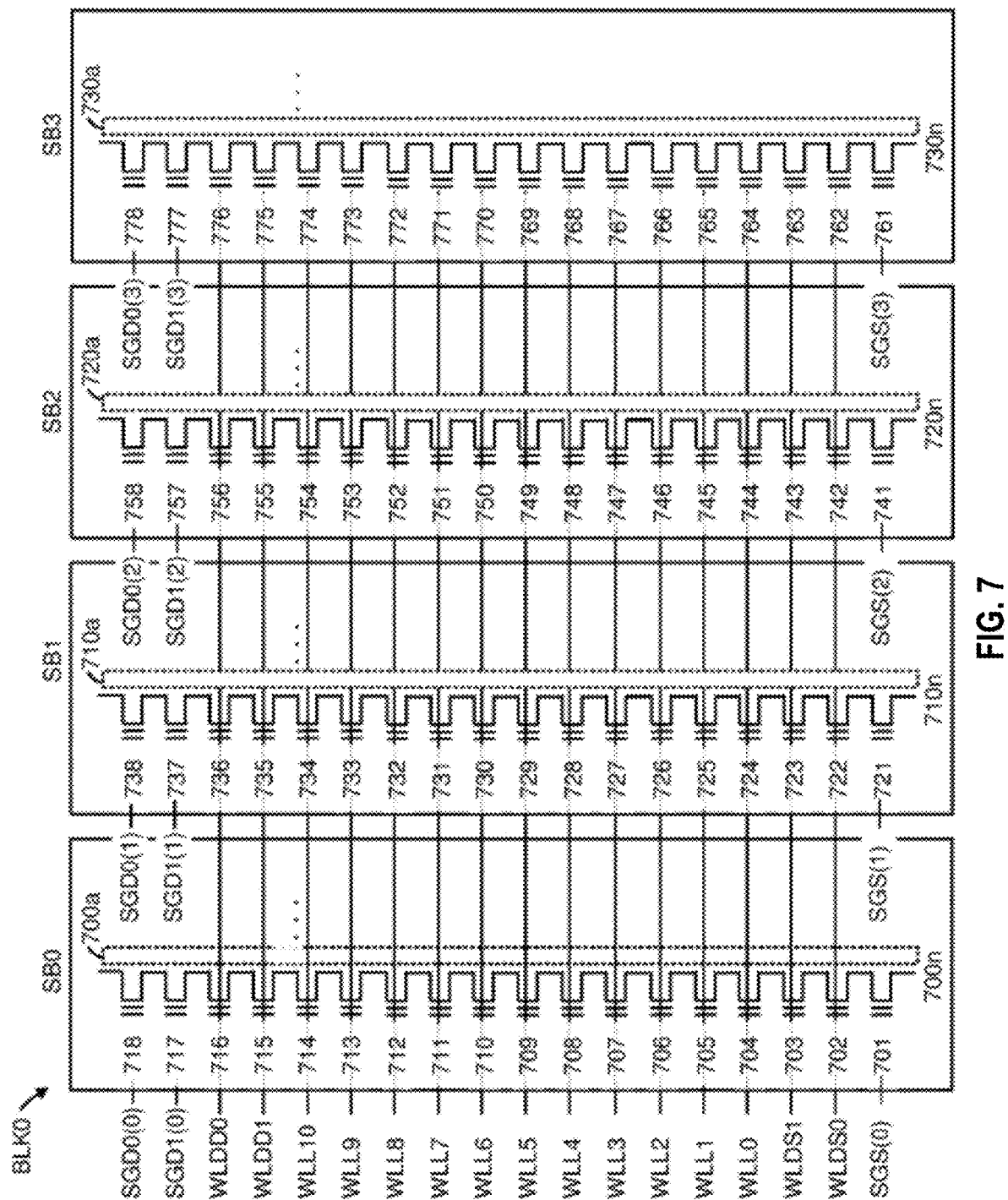
FIG. 7 depicts an example view of NAND strings in a block BLK0 which is consistent with FIGS. 4 and 6A.

FIG. 7 depicts an example view of NAND strings in the block BLK0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines, and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. Another option programs all of the memory cells in one sub-block, one word line at a time, before programming the memory cells of the next sub-block. The word line programming order may start at WL0, the source-end word line and end at WLL10, the drain-end word line, for example.

The NAND strings 700n, 710n, 720n and 730n have channels 700a, 710a, 720a and 730a, respectively.

Additionally, NAND string 700n includes SGS transistor 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistor 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistor 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistor 761, dummy memory cells 762 and 763, data memory cells 764, 765, 766, 767, 768, 769, 770, 771, 772, 773 and 774, dummy memory cells 775 and 776, and SGD transistors 777 and 778.

One or more SGD transistors are provided at the drain-end of each NAND string, and one or more SGS transistors are provided at the source-end of each NAND string. The SGD transistors in SB0, SB1, SB2 and SB3 may be driven by separate control lines SGD0(0) and SGD1(0), SGD0(1) and SGD1(1), SGD0(2) and SGD1(2), and SGD0(3) and SGD1(3), respectively, in one approach. In another approach, all of the SGD transistors in a sub-block are connected and commonly driven. The SGS transistors in SB0, SB1, SB2 and SB3 may be driven by separate control lines SGS(0), SGS(1), SGS(2) and SGS(3), respectively. In another approach, all of the SGS transistors in a block are connected and commonly driven.

Figure 8A:
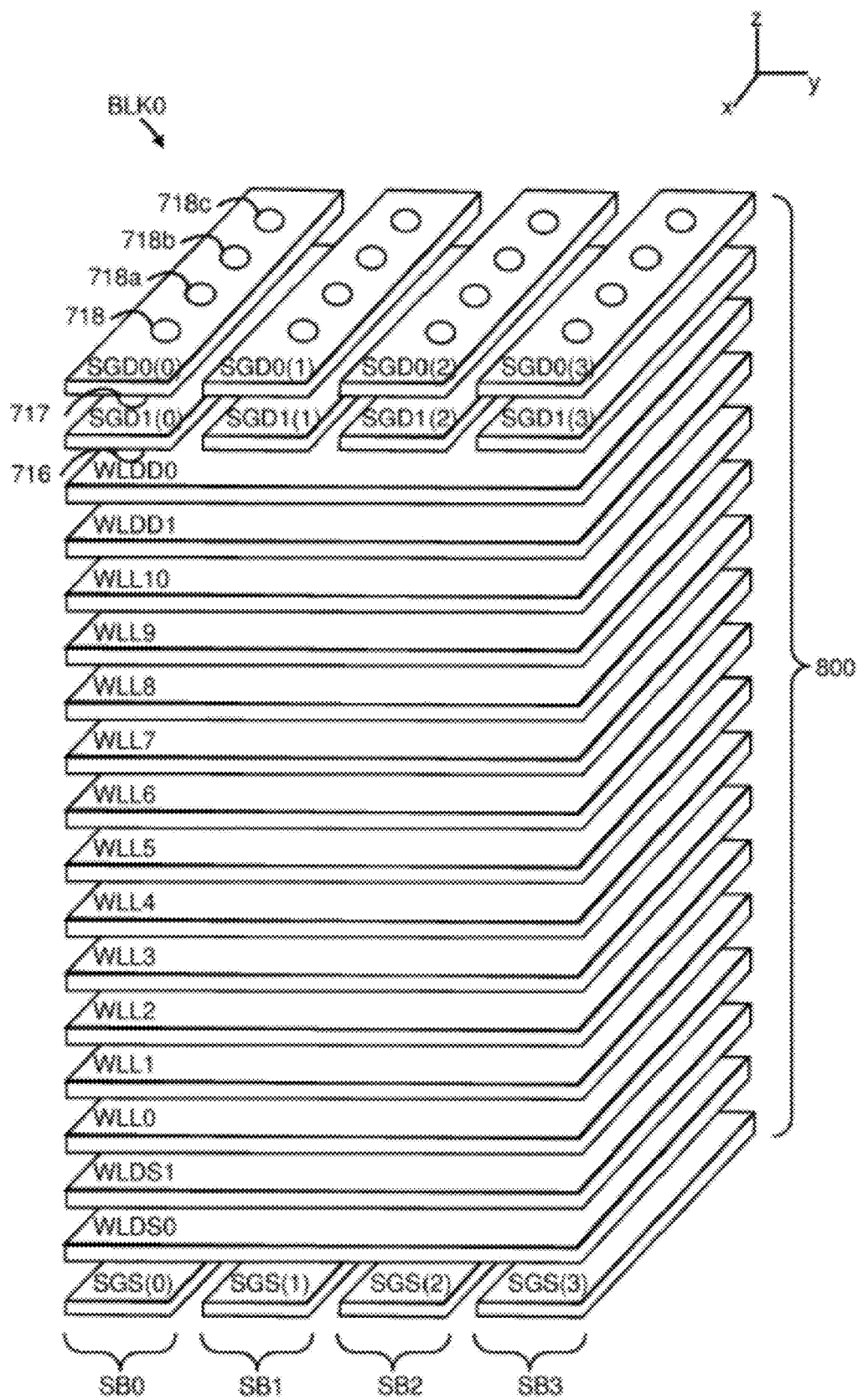
FIG. 8A depicts control gate layers in the block BLK0 consistent with FIG. 7.

FIG. 8A depicts control gate layers in the block BLK0 consistent with FIG. 7. The control gate layers are arranged in a stack 800 and include dummy word lines layers or control gate layers WLDS0, WLDS1, WLDD0 and WLDD1, and data word line layers or control gate layers WLL0-WLL10, which are shared among the different sub-blocks SB0-SB3. The control gate layers include a separate SGS control gate layer for each sub-block, e.g., SGS(0)-SGS(3) and separate SGD control gate layers for each sub-block. For example, SB0 includes SGD0(0) and SGD1(0), SB1 includes SGD0(1) and SGD1(1), SB2 includes SGD0(2) and SGD1(2), and SB3 includes SGD0(3) and SGD1(3). Additionally, four example memory holes are depicted in each sub-block. SGD transistors 718, 718a, 718b and 718c are depicted in SGD0(0), SGD transistor 717 is depicted in SGD1(0) and dummy memory cell 716 is depicted in WLDD0.

Figure 8B:
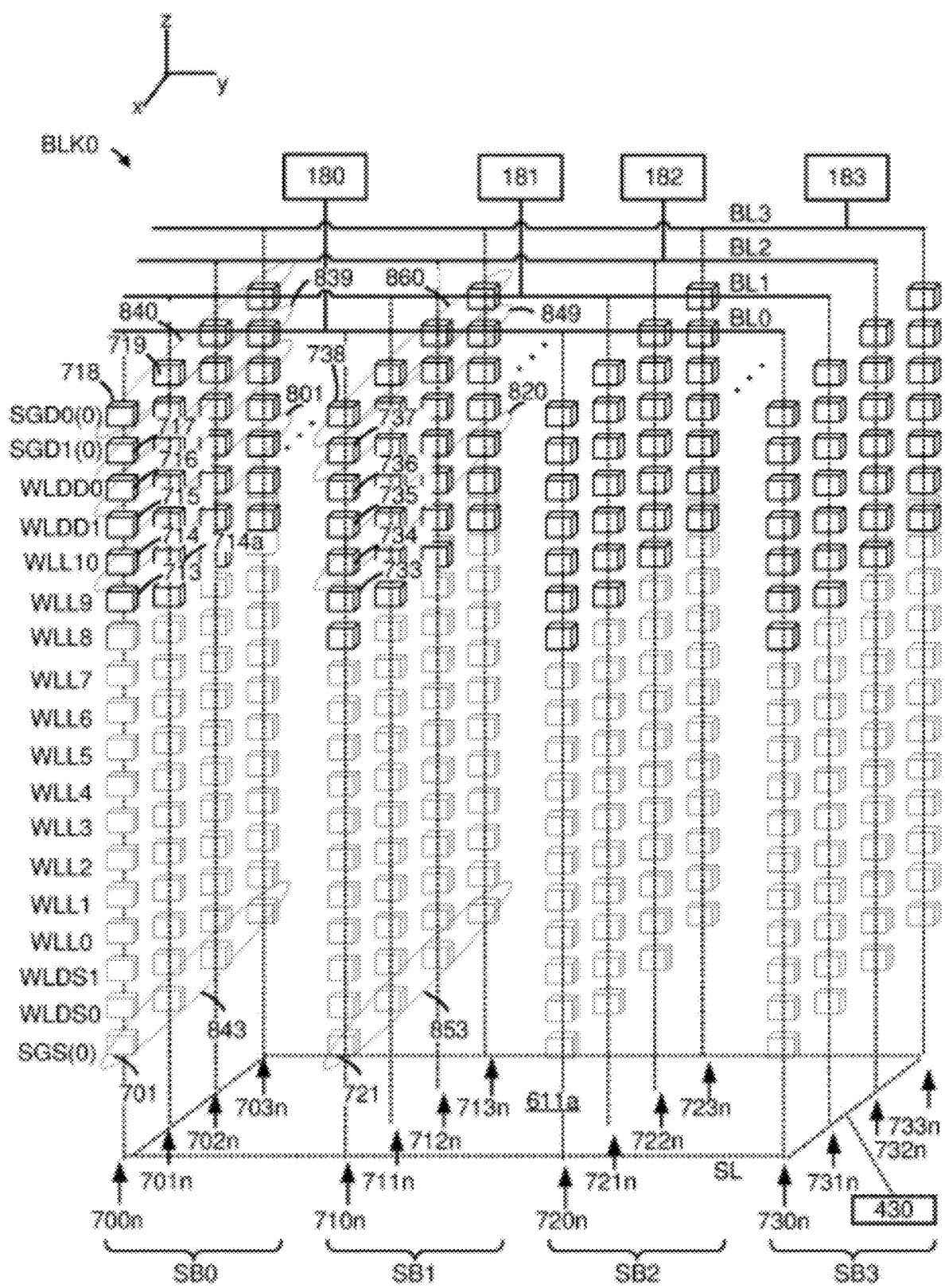
FIG. 8B depicts control gate layers in the block BLK0 consistent with FIG. 7.

FIG. 8B depicts additional detail of the block BLK0 of FIG. 7. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sense circuits may be connected to each bit line. For example, sense circuits 180, 181, 182 and 183 of FIG. 2 are connected to bit lines BL0, BL1, BL2 and BL3.

Programming and reading can occur for selected cells in one word line and one sub-block at a time. This allows each selected cell to be controlled by a respective bit line and/or source line. For example, a set of memory cells 801, which includes an example memory cell 714, is connected to WLL10 in SB0. This is the drain-end data word line. WLL0 is the source-end data word line. A set of memory cells may be programmed or read concurrently. An additional set of memory cells is connected to WLL10 in each of the other sub-blocks SB1-SB3. For example, a set of memory cells 820, which includes an example memory cell 734, is connected to WLL10 in SB1.

In this example, the source line SL or source region is driven at a voltage Vsl by the well voltage driver 430. Moreover, the source line is common to the sub-blocks of the block. In another option, each sub-block has a respective source line so that the source lines can be se differently for a selected sub-block which is undergoing a read or program operation, for example, compared to an unselected sub-block which is not undergoing the read or program operation.

Each NAND string includes one or more SGD transistors at the drain-end and one or more SGS transistors at the source end. In this case, there are two SGD transistors and one SGS transistor per string. Each SGD transistor may be connected to separate control line layer, as in FIG. 8A, so that it can be driven separately, or the two or more SGD transistors in a NAND string may have their control gates connected and commonly driven. For example, SB0 has sets of SGD transistors 840 and 839, with example SGD transistors 718 and 717, respectively, in the NAND string 700n. The set of SGD transistors 840 also includes an example SGD transistor 719 in the NAND string 701n. SB0 also has a set of SGS transistors 843, with an example SGS transistor 701 in the NAND string 700n. Similarly, SB1 has sets of SGD transistors 860 and 849, with example SGD transistors 738 and 737, respectively, in the NAND string 710n. SB1 also has a set of SGS transistors 853, with an example SGS transistor 721 in the NAND string 710n.

The NAND string 700n includes SGD transistors 718 and 717 connected to select gate lines SGD0(0) and SGD1(0), respectively, dummy memory cells 716 and 715 connected to WLDD0 and WLDD1, respectively, and data memory cells 714 and 713 connected to WLL10 and WLL9, respectively. The NAND string 710n includes SGD transistors 738 and 737 connected to select gate lines SGD0(1) and SGD1 (1) (see FIG. 7), respectively, dummy memory cells 736 and 735 connected to WLDD0 and WLDD1, respectively, and data memory cells 734 and 733 connected to WLL10 and WLL9, respectively.

Figure 9A:
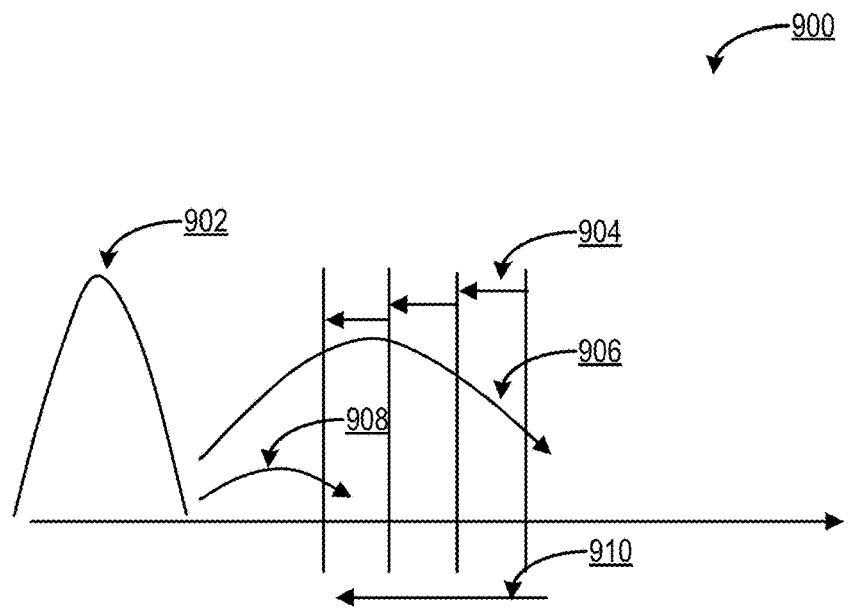
FIG. 9A depicts an example scenario involving a data retention effect during a programming sequence.

FIG. 9A depicts an example scenario 900 involving a data retention effect during a programming sequence. As illustrated in FIG. 9A, a normal (or natural) voltage distribution 902 associated with a programming sequence can include fast bits 906 that are generally close to the upper tail of the normal voltage distribution 902. The normal voltage distribution 902 associated with the programming sequence can also include slow bits 908 that are generally close to the lower tail of the normal voltage distribution 902. During the programming sequence, the fast bits 906 are programmed to memory cells, and the memory cells pass verification voltage levels 904. This occurs before the slow bits 908 are programmed to memory cells, and the memory cells pass the verification voltage levels 904. With an application of a data retention effect 910, electron loss in the memory cell associated with the fast bits 906 causes the fast bits 906 to downshift, causing them to fall near the lower tail of a final voltage distribution associated with the programming sequence. This has the effect of widening the final voltage distribution associated with the programming sequence. As the final voltage distribution has been widened, the margin between the final voltage distribution and a subsequent voltage distribution becomes smaller. The widening of the final voltage distribution and the shrinking of the margin between the final voltage distribution and the subsequent voltage distribution may cause errors in the programming operation.

Figure 9B:
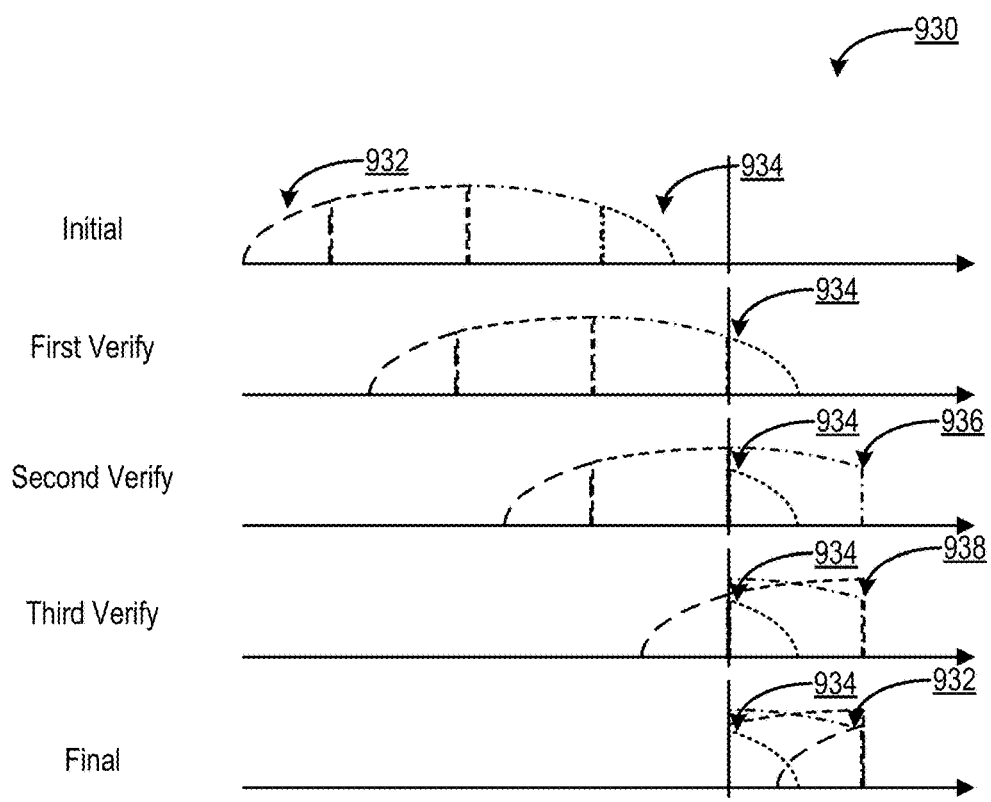
FIG. 9B depicts an example scenario involving a data retention effect during a programming sequence.

FIG. 9B depicts an example scenario 930 involving a data retention effect during a programming sequence. In a programming sequence, a normal (or natural) voltage distribution associated with the programming sequence can include fast bits 934 at an upper tail of the normal voltage distribution and slow bits 932 at the lower tail of the normal voltage distribution. The programming sequence can include a number of program loops (or program steps). The programming sequence depicted in the example scenario 930 involves four program loops, but other numbers are possible. The program loops can involve programming operations to program memory cells and verify operations to verify the programming of the memory cells. For example, a program loop can be determined to be completed when a voltage associated with the program loop satisfies a target verify voltage or a target voltage threshold. In an initial state of the programming sequence depicted in the example scenario 930, no programming operations or verify operations have been performed on the bits associated with the normal voltage distribution. As no programming operations and no verify operations have been performed on the memory bits associated with the normal voltage distribution, no final voltage distribution is depicted. In a first program loop of the programming sequence, a first verify operation is performed on memory cells on which the fast bits 934 associated with the normal voltage distribution have been programmed. The contribution of the fast bits 934 to the final voltage distribution is depicted, with the fast bits 934 at the lower tail of the final voltage distribution. In a second program loop of the programming sequence, a second verify operation is performed on memory cells on which a second set of bits 936 associated with the normal voltage distribution have been programmed. The contribution of the second set of bits 936 to the final voltage distribution is depicted with the second set of bits 936 across the range of the final voltage distribution. In a third program loop of the programming sequence, a third verify operation is performed on memory cells on which a third set of bits 938 associated with the normal voltage distribution have been programmed. The contribution of the third set of bits 938 to the final voltage distribution is depicted with the third set of bits 938 across the range of the final voltage distribution. In a fourth, or final, program loop of the programming sequence, a fourth verify operation is performed on memory cells on which the slow bits 932 associated with the normal voltage distribution have been programmed. The contribution of the slow bits 932 to the final voltage distribution is depicted, with the slow bits 932 at the upper tail of the final voltage distribution. As illustrated in the final program loop, the fast bits 934 contribute to the lower tail of the final voltage distribution. As the fast bits 934 contribute to the lower tail of the final voltage distribution, downshifting of the fast bits 934 due to the data retention effect would widen the final voltage distribution by extending the lower tail of the final voltage distribution. This widening of the final voltage distribution would also reduce a margin between the final voltage distribution and a subsequent voltage distribution. The widening of the final voltage distribution and the shrinking of the margin between the final voltage distribution and the subsequent voltage distribution may cause errors in the programming operation. Thus, as further described herein, one approach to challenges associated with the data retention effect is to upshift the fast bits 934 to counteract the data retention effect.

Figure 9C:
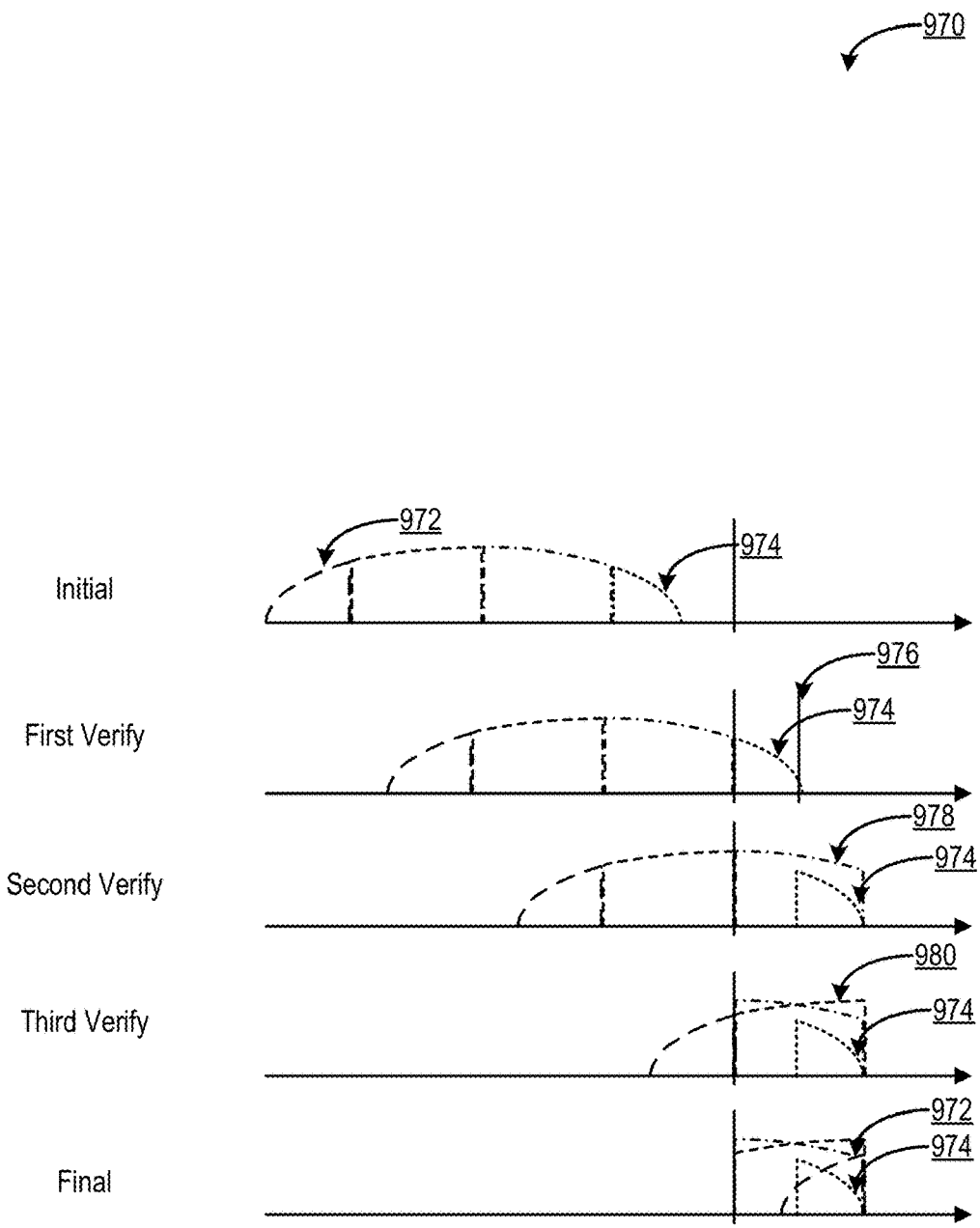
FIG. 9C depicts an example scenario involving an upshift to counteract a data retention effect during a programming sequence.

FIG. 9C depicts an example scenario 970 involving an upshift to counteract a data retention effect during a programming sequence. In a programming sequence, a normal (or natural) voltage distribution associated with the programming operation can include fast bits 974 at an upper tail of the normal voltage distribution and slow bits 972 at the lower tail of the normal voltage distribution. The programming sequence can include a number of program loops (or program steps). The programming sequence depicted in the example scenario 970 involves four program loops, but other numbers are possible. The program loops can involve programming operations to program memory cells and verify operations to verify the programming of the memory cells. For example, a program loop can be determined to be completed when a voltage associated with the program loop satisfies a target verify voltage. In the example scenario 970, an additional verify operation can determine whether to apply a bit line voltage during the program loop. The determination of whether to apply the bit line voltage during the program loop can be based on an additional target verify voltage or an additional target voltage threshold associated with the bit line voltage. The additional verify operation can follow a verify operation to determine whether a voltage associated with the programming loop satisfies a target verify voltage associated with verifying the programming of a memory cell. If a voltage associated with the program loop satisfies the target verify voltage but fails to satisfy the additional target verify voltage, a bit line voltage can be applied during the program loop. This application of the bit line voltage has the effect of upshifting programmed bits associated with the program loop and counteracting the data retention effect.

As illustrated in FIG. 9C, an initial state of the programming sequence depicted in the example scenario 970, no programming operations or verify operations have been performed on the bits associated with the normal voltage distribution. In a first program loop of the programming sequence, a first verify operation is performed on memory cells on which the fast bits 974 associated with the normal voltage distribution have been programmed. An additional verify operation 976 is performed on the memory cells on which the fast bits 974 have been programmed. Based on the additional verify operation 976, a bit line voltage can be applied during the first program loop. The contribution of the fast bits 976 to the final voltage distribution is depicted, with the fast bits upshifted from the lower tail of the final voltage distribution to the upper tail of the final voltage distribution. In a second program loop of the programming sequence, a second verify operation is performed on memory cells on which a second set of bits 978 associated with the normal voltage distribution have been programmed. The contribution of the second set of bits 978 to the final voltage distribution is depicted with the second set of bits 978 across the range of the final voltage distribution. In a third program loop of the programming sequence, a third verify operation is performed on memory cells on which a third set of bits 980 associated with the normal voltage distribution have been programmed. The contribution of the third set of bits 980 to the final voltage distribution is depicted with the third set of bits 980 across the range of the final voltage distribution. In a fourth, or final, program loop of the programming sequence, a fourth verify operation is performed on memory cells on which the slow bits 972 associated with the normal voltage distribution have been programmed. The contribution of the slow bits 972 to the final voltage distribution is depicted, with the slow bits 972 at the upper tail of the final voltage distribution. As illustrated in the final program loop, the fast bits 974 have been upshifted to contribute to the upper tail of the final voltage distribution. As the fast bits 974 contribute to the upper tail of the final voltage distribution, effects of any downshifting of the fast bits 974 due to the data retention effect can be avoided.

Figure 10:
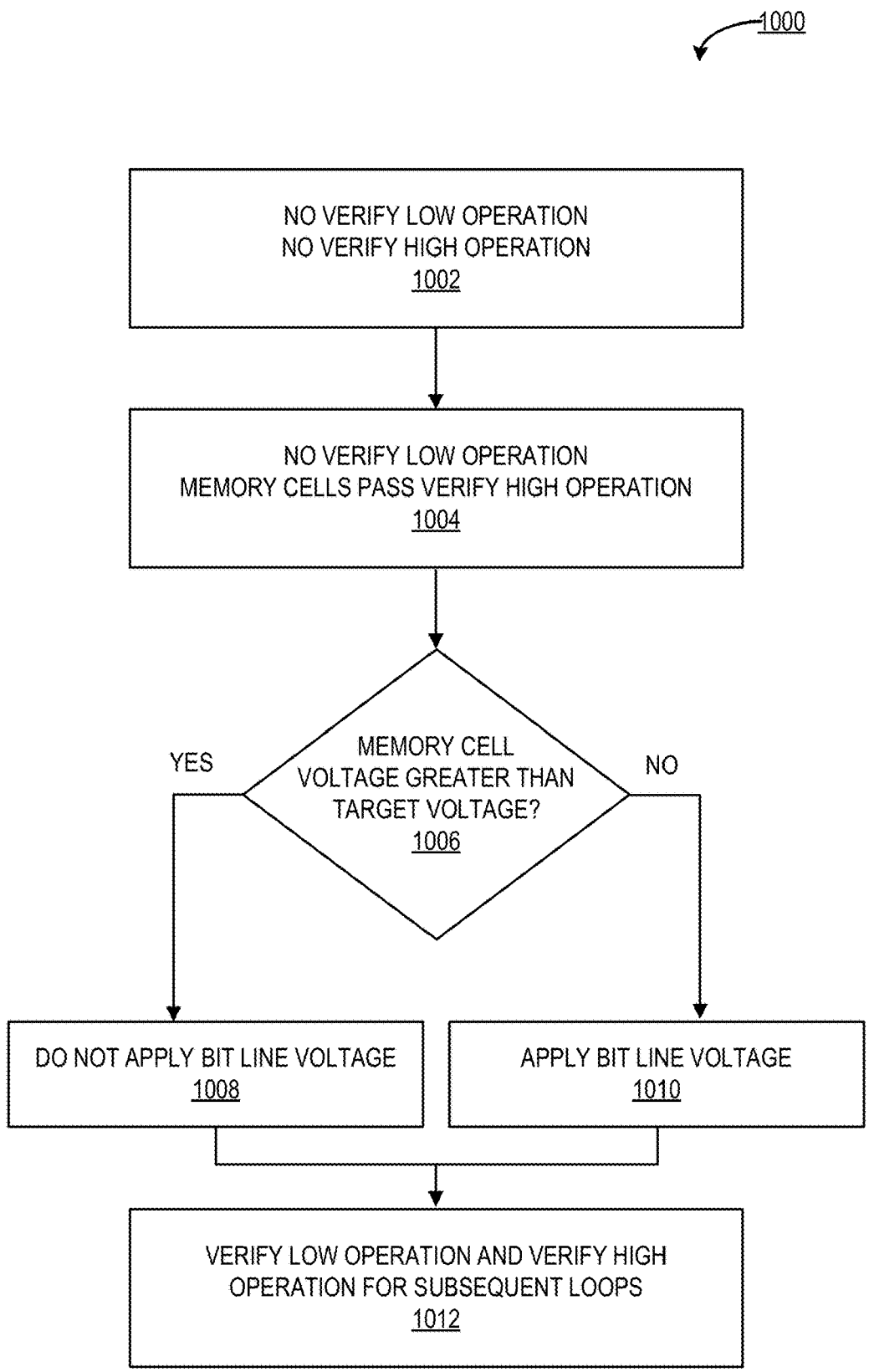
FIG. 10 depicts an example process associated with improving data retention reliability.

FIG. 10 depicts an example process 1000 associated with improving data retention reliability. As described herein, data retention reliability can be improved by applying a bit line voltage during a program loop involving fast bits. By applying the bit line voltage during the program loop, the fast bits are upshifted to counteract downshifting effects caused by charge leakage or electron loss (e.g., data retention effect). It should be understood that there can be additional, fewer, or alternative steps performed in similar or alternative orders, or in parallel, based on the various features and embodiments discussed herein unless otherwise stated.

As illustrated in FIG. 10, step 1002 involves a program loop where no verify low operations and no verify high operations are performed. In various embodiments, verify operations associated with a programming sequence can include a verify low operation and a verify high operation. The verify low operation can, for example, identify noise based on a voltage associated with a programming operation of a memory cell being below a low target voltage or failing to satisfy a low target voltage threshold. The verify high operation can, for example, determine a completion of a programming operation of a memory cell based on a voltage associated with the programming operation of the memory cell exceeding a high target voltage or satisfying a high target voltage threshold. In various embodiments, step 1002 can be associated with an initial state of a programming sequence or an initial program loop. In the initial state, no programming operation or verify operation has been performed. As such, no verify low operations and no verify high operations are performed. Following the programming operation of a memory cell, the example process 1000 may advance to a next program loop or step 1004.

As illustrated in FIG. 10, step 1004 involves a program loop where no verify low operation is performed and memory cells pass a verify high operation. In various embodiments, verify operations associated with a programming sequence can include a verify low operation and a verify high operation. Further, the verify operations can include an additional target voltage, or additional target voltage threshold, associated with applying a bit line voltage. In these embodiments, the verify operations can forego the verify low operation until the additional target voltage has been exceeded or satisfied. In this way, performance degradation associated with including additional verification operations can be avoided. Accordingly, in step 1004, no verify low operation is performed with respect to the program loop as the additional target voltage has not yet been exceeded or satisfied. Following a determination that a voltage associated with the memory cell has passed the verify high operation, the example process 1000 may advance to step 1006.

As illustrated in FIG. 10, step 1006 involves a determination of whether a memory cell voltage exceeds a target voltage. In various embodiments, as described herein, an additional target voltage, or additional target voltage threshold, can serve as a basis for a determination of whether to apply a bit line voltage during the program loop. The additional target voltage, or additional target voltage threshold, can be based on a final voltage distribution associated with a programming sequence. For example, the additional target voltage can be tuned to a middle of the final voltage distribution. In this way, the additional target voltage can be tuned such that an application of a bit line voltage to a program voltage that exceeds or satisfies the additional target voltage will not result in a program voltage that exceeds a verify high target voltage. By tuning the additional target voltage in this way, an upshift of fast bits will not exceed the upper tail of a final voltage distribution.

At step 1006, memory cells have passed the verify high operation, indicating a completion of a programming operation associated with the memory cells. As this is the first program loop following the initial programming sequence state (in step 1002), the memory cells have been programmed with fast bits of the programming sequence. Step 1006 can involve determining whether to apply a bit line voltage to a memory cell of these memory cells to upshift the fast bits programmed therein. The determination can be based on a target voltage, such as the additional target voltage described herein. The bit line voltage can be applied during the program loop in accordance with the determination.

As illustrated in FIG. 10, step 1008 involves not applying a bit line voltage during a program loop. The bit line voltage is not applied based on a determination that a memory cell voltage exceeds or satisfies a target voltage, or target voltage threshold. As the memory cell voltage exceeds or satisfies the target voltage, an application of a bit line voltage during the program loop may result in an upshift of the fast bits associated with the program loop to exceed the upper tail of a final voltage distribution associated with the programming sequence. Accordingly, the bit line voltage is not applied where the memory cell voltage exceeds or satisfies the target voltage.

As illustrated in FIG. 10, step 1010 involves applying a bit line voltage during a program loop. The bit line voltage is applied based on a determination that a memory cell voltage does not exceed or fails to satisfy a target voltage, or target voltage threshold. Where the memory cell voltage does not exceed the target voltage, an application of a bit line voltage during the program loop raises the program voltage without exceeding the verify high target voltage associated with completion of a programming operation. In this way, the fast bits associated with the program loop are upshifted without exceeding the upper tail of a final voltage distribution associated with the programming sequence. Accordingly, the bit line voltage is applied to upshift the fast bits and counteract any data retention effects and program errors associated with the data retention effect.

As illustrated in FIG. 10, step 1012 involves applying verify low operations and verify high operations for subsequent program loops. In various embodiments, the bits following the fast bits of a programming sequence generally fall within the final voltage distribution associated with the programming sequence. As such, upshifting these bits is less likely to reduce any data retention effects and program errors associated with the data retention effect. Accordingly, for subsequent program loops following a determination of whether to apply a bit line voltage to fast bits of a programming sequence, verify operations can be applied, for example, to identify noise associated with a program loop or to determine a completion of a programming operation. For this purpose, verify operations of subsequent program loops can include a verify low operation to identify noise associated with the program loop and a verify high operation to determine the completion of a programming operation.

As an illustrative example of the process 1000 depicted in FIG. 10, a programming sequence can include a number of program loops where programming operations are performed on memory cells of a memory device. The program loops can include verify operations to identify noise and determine completion of the programming operations. Further, within the program loops a determination can be made as to whether to apply a bit line voltage during a program loop based on whether a memory cell voltage exceeds or satisfies a target voltage, or target voltage threshold. For example, in a first program loop of a program sequence, programming operations can be applied to memory cells of a memory device. In the first program loop, no verify low operation is performed on the memory cells, and none of the memory cells have voltage that pass the verify high operation. In a second program loop of the program sequence, programming operations continue to be applied to memory cells of the memory device. No verify low operation is performed on the memory cells. In the second program loop, some of the memory cells pass the verify high operation, indicating a completion of programming operations associated with the memory cells. For the memory cells on which programming operations have been performed up to this point, a determination is made as to whether the memory cell voltage associated with the memory cells exceeds a target voltage for applying a bit line voltage. For the memory cells that do not exceed the target voltage, a bit line voltage can be applied, with the effect of upshifting the fast bits stored in the memory cells. For the memory cells that exceed the target voltage, no bit line voltage is applied. In a third program loop, and in subsequent program loops, programming operations continue to be applied to the memory cells of the memory device. At this point, the fast bits associated with the programming sequence have been addressed, either by applying a bit line voltage or not based on whether the memory cell voltage of the corresponding memory cells exceed the target voltage. Accordingly, verify operations are performed in the third program loop, and in subsequent program loops, that include a verify low operation to identify noise and a verify high operation to determine completion of programming operations. As illustrated in this example, no program loop includes more than two verify operations where memory cell voltage is compared with, for example, a target voltage, a low verify target voltage, or a high verify target voltage. Accordingly, there is no performance loss in this example compared to, for example, a programming sequence that uses a low verify operation and a high verify operation for each program loop.

Figure 11A:
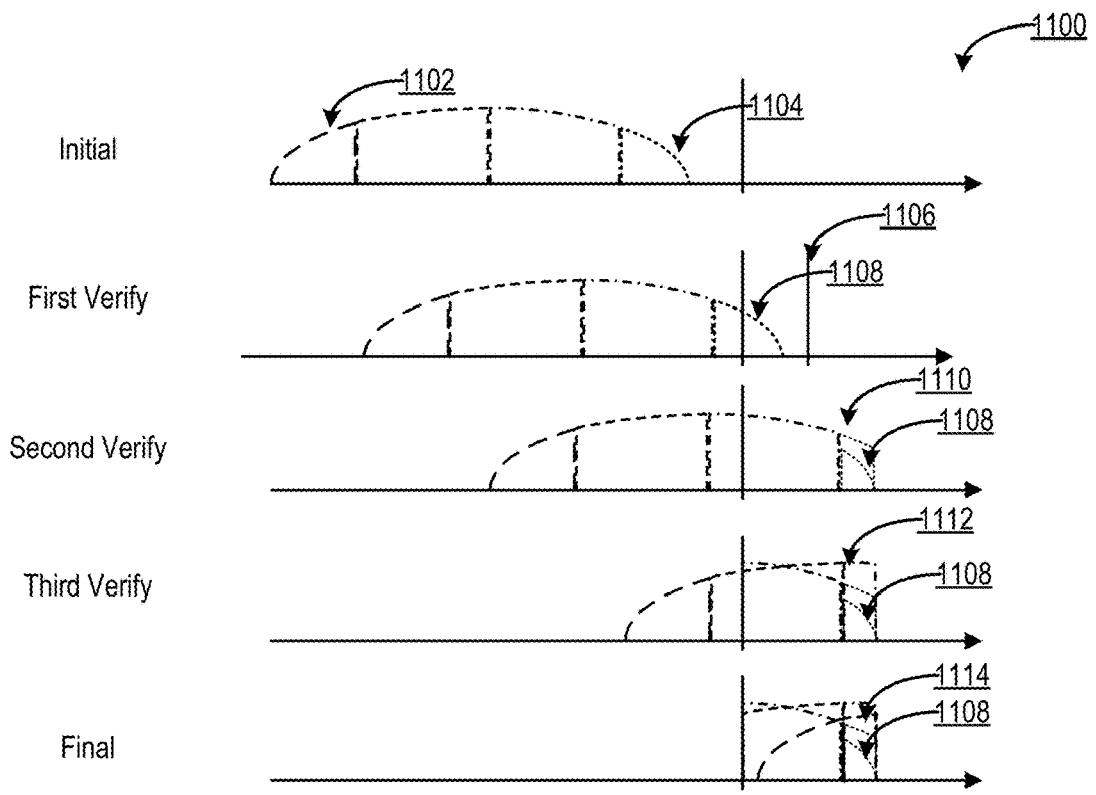
FIG. 11A depicts an example scenario involving an upshift to counteract a data retention effect during a programming sequence.

FIG. 11A depicts an example scenario 1100 involving an upshift to counteract a data retention effect during a programming sequence. Compared to the example scenario 970 of FIG. 9C, the example scenario 1100 involves application of a bit line voltage to a number of memory cells that is less than the number of memory cells to which a bit line voltage was applied in the example scenario 970 of FIG. 9C. For example, the example scenario 1100 may involve an application of a bit line voltage to less than all fast bits associated with a programming sequence.

As illustrated in FIG. 11A, a programming sequence can include fast bits 1104 at an upper tail of a normal voltage distribution and slow bits 1102 at a lower tail of the normal voltage distribution. In an initial program loop of the programming sequence, no programming operations or verify operations have been performed on the bits associated with the normal voltage distribution. In a first program loop of the programming sequence, a first verify operation is performed on memory cells on a portion of fast bits 1108 from the fast bits 1104. An additional verify operation 1106 is performed on the memory cells on which the portion of fast bits 1108 have been programmed. Based on the additional verify operation 1106, a bit line voltage can be applied during the first program loop. The contribution of the portion of fast bits 1108 to the final voltage distribution is depicted, with the portion of fast bits 1108 upshifted from the lower tail of the final voltage distribution to the upper tail of the final voltage distribution. In a second program loop of the programming sequence, a second verify operation is performed on memory cells on which a second set of bits 1110 associated with the normal voltage distribution have been programmed. The second set of bits 1110 includes the remainder of the fast bits 1104. The contribution of the second set of bits 1110 to the final voltage distribution is depicted with the second set of bits 1110 across the range of the final voltage distribution. In a third program loop of the programming sequence, a third verify operation is performed on memory cells on which a third set of bits 1112 associated with the normal voltage distribution have been programmed. The contribution of the third set of bits 1112 to the final voltage distribution is depicted with the third set of bits 1112 across the range of the final voltage distribution. In a fourth, or final, program loop of the programming sequence, a fourth verify operation is performed on memory cells on which a fourth set of bits 1114, which includes the slow bits 1102 associated with the normal voltage distribution, have been programmed. The contribution of the fourth set of bits 1114 to the final voltage distribution is depicted. As illustrated in the final program loop, the portion of fast bits 1108 have been upshifted to contribute to the upper tail of the final voltage distribution. Similarly, the remainder of the fast bits 1104 also contribute to the upper tail of the final voltage distribution by virtue of being included in the second set of bits 1110. As the fast bits 1104 contribute to the upper tail of the final voltage distribution, effects of any downshifting of the fast bits 1104 due to the data retention effect can be avoided.

Figure 11B:
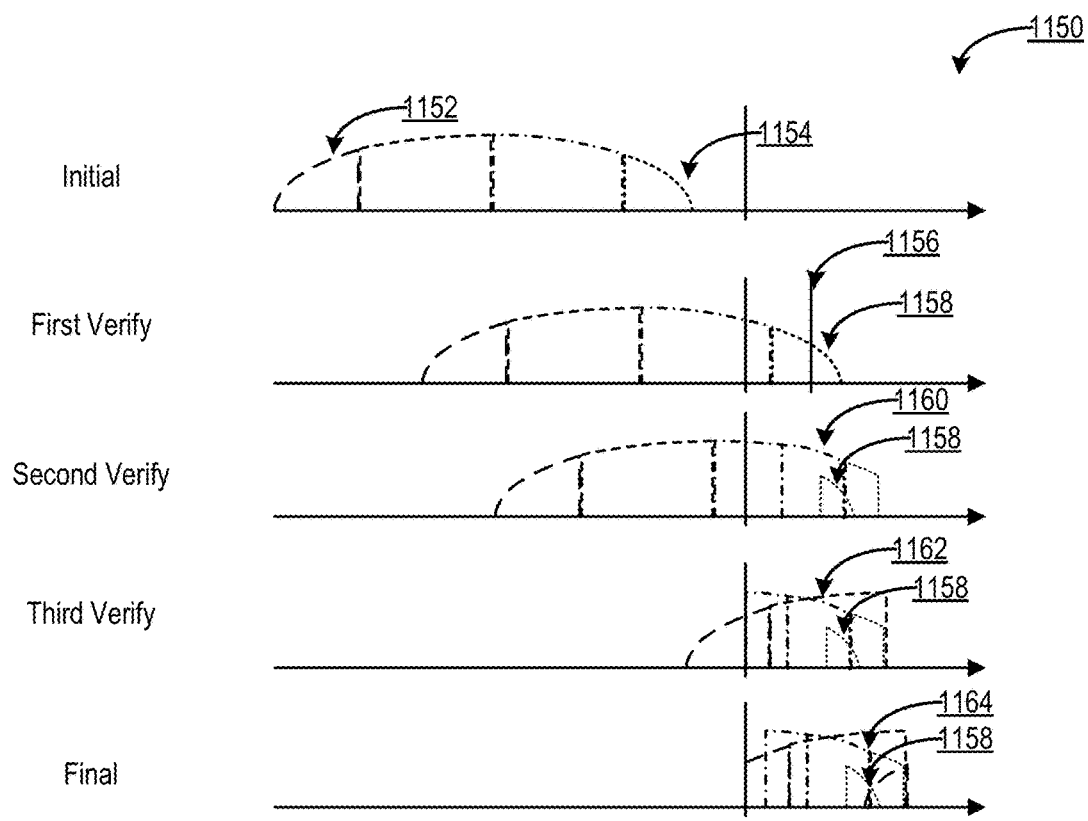
FIG. 11B depicts an example scenario involving an upshift to counteract a data retention effect during a programming sequence.

FIG. 11B depicts an example scenario 1150 involving an upshift to counteract a data retention effect during a programming sequence. Compared to the example scenario 970 of FIG. 9C, the example scenario 1150 involves application of a bit line voltage to a number of memory cells that is more than the number of memory cells to which a bit line voltage was applied in the example scenario 970 of FIG. 9C. For example, the example scenario 1150 may involve an application of a bit line voltage to a set of bits that includes all the fast bits, as well as additional bits, associated with a programming sequence.

As illustrated in FIG. 11B, a programming sequence can include fast bits 1154 at an upper tail of a normal voltage distribution and slow bits 1152 at a lower tail of the normal voltage distribution. In an initial program loop of the programming sequence, no programming operations or verify operations have been performed on the bits associated with the normal voltage distribution. In a first program loop of the programming sequence, a first verify operation is performed on memory cells on a first set of bits 1158 that includes the fast bits 1154 and additional bits. An additional verify operation 1156 is performed on the memory cells on which the first set of bits 1158 have been programmed. Based on the additional verify operation 1156, a bit line voltage can be applied during the first program loop. The contribution of the first set of bits 1158 to the final voltage distribution is depicted, with the first set of bits 1158, including the fast bits 1154, upshifted to the upper tail of the final voltage distribution. In a second program loop of the programming sequence, a second verify operation is performed on memory cells on which a second set of bits 1160 associated with the normal voltage distribution have been programmed. The contribution of the second set of bits 1160 to the final voltage distribution is depicted with the second set of bits 1160 across the range of the final voltage distribution. In a third program loop of the programming sequence, a third verify operation is performed on memory cells on which a third set of bits 1162 associated with the normal voltage distribution have been programmed. The third set of bits 1162 includes a portion of the slow bits 1152. The contribution of the third set of bits 1162 to the final voltage distribution is depicted with the third set of bits 1162 across the range of the final voltage distribution. In a fourth, or final, program loop of the programming sequence, a fourth verify operation is performed on memory cells on which a fourth set of bits 1164, which includes the remainder of the slow bits 1152 associated with the normal voltage distribution, have been programmed. The contribution of the fourth set of bits 1164 to the final voltage distribution is depicted. As illustrated in the final program loop, a portion of the fast bits 1154 are not upshifted to contribute to the upper tail of the final voltage distribution but are nonetheless upshifted away from the lower tail of the final voltage distribution. Thus, as the fast bits 1154 are not contributing to the lower tail of the final voltage distribution, effects of any downshifting of the fast bits 1154 due to the data retention effect can be avoided.

FIGS. 12A-12D depict example scenarios involving alternative approaches to counteracting a data retention effect during a programming sequence. As illustrated in these example scenarios, one approach to counteracting a data retention effect is to adjust a verify high target voltage for each program loop of a programming sequence. This approach may, in some cases, counteract the data retention effect by altering the placement of fast bits in a final voltage distribution. However, this approach, in other cases, may not sufficiently alter the placement of fast bits in the final voltage distribution to counteract the data retention effect. Further, this approach, in other cases, may alter the placement of fast bits in the final voltage distribution such that the final voltage distribution is widened, which along with the data retention effect may cause programming errors.

Figure 12A:
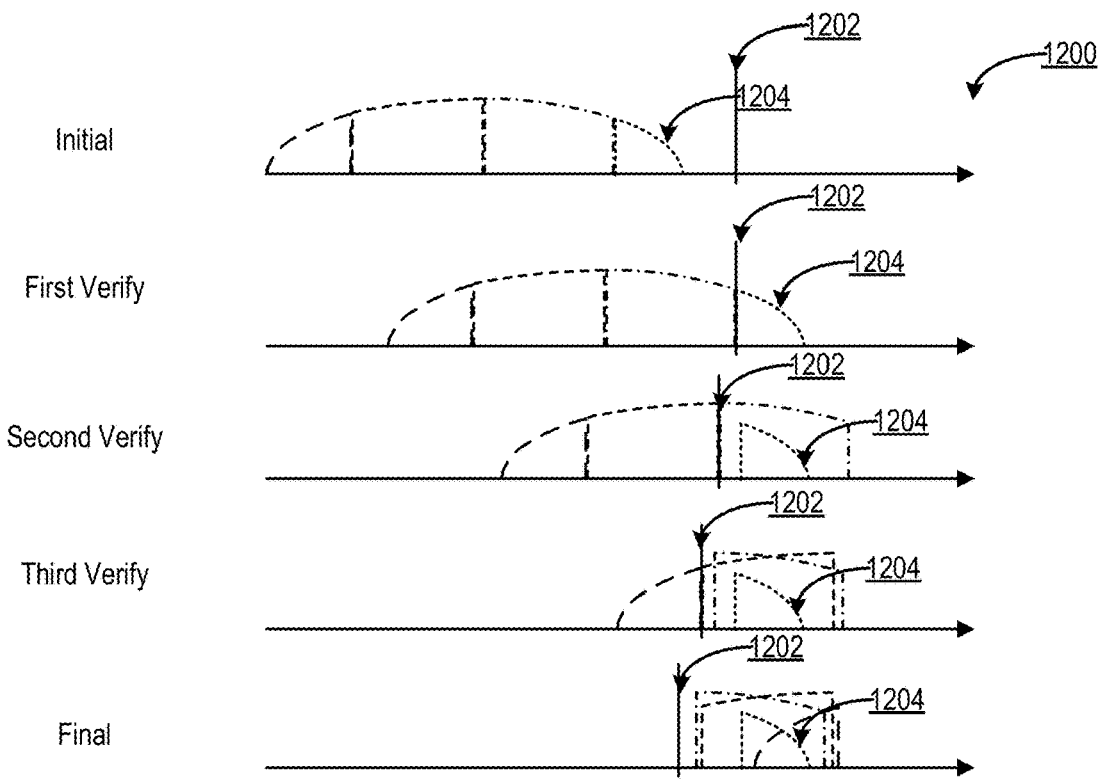
FIGS. 12A-12D depict example scenarios involving alternative approaches to counteracting a data retention effect during a programming sequence.

FIG. 12A depicts an example scenario 1200 involving adjustment of a verify high target voltage 1202 for each program loop of a programming sequence that includes fast bits 1204 at an upper tail of a normal voltage distribution. In an initial program loop of the programming sequence, no programming operations or verify operations have been performed on the bits associated with the normal voltage distribution. In a first program loop of the programming sequence, a first verify operation involving a verify high target voltage 1202 is performed on memory cells on which the fast bits 1204 have been programmed. Following the first program loop, the verify high target voltage 1202 is raised. In the second program loop of the programming sequence, a second verify operation involving the raised verify high target voltage 1202 is performed on memory cells of a second set of bits. Following the second program loop, the verify high target voltage 1202 is raised again. In the third program loop of the programming sequence, a third verify operation involving the raised verify high target voltage 1202 is performed on memory cells of a third set of bits. Following the third program loop, the verify high target voltage 1202 is raised again. In the fourth, or final program loop of the programming sequence, a fourth verify operation involving the raised verify high target voltage 1202 is performed on memory cells of a fourth set of bits, which can be the slow bits of the normal voltage distribution. As illustrated in FIG. 12A, by raising the verify high target voltage 1202 for each program loop, the fast bits of the normal voltage distribution are shifted up toward the middle of a final voltage distribution.

Figure 12B:
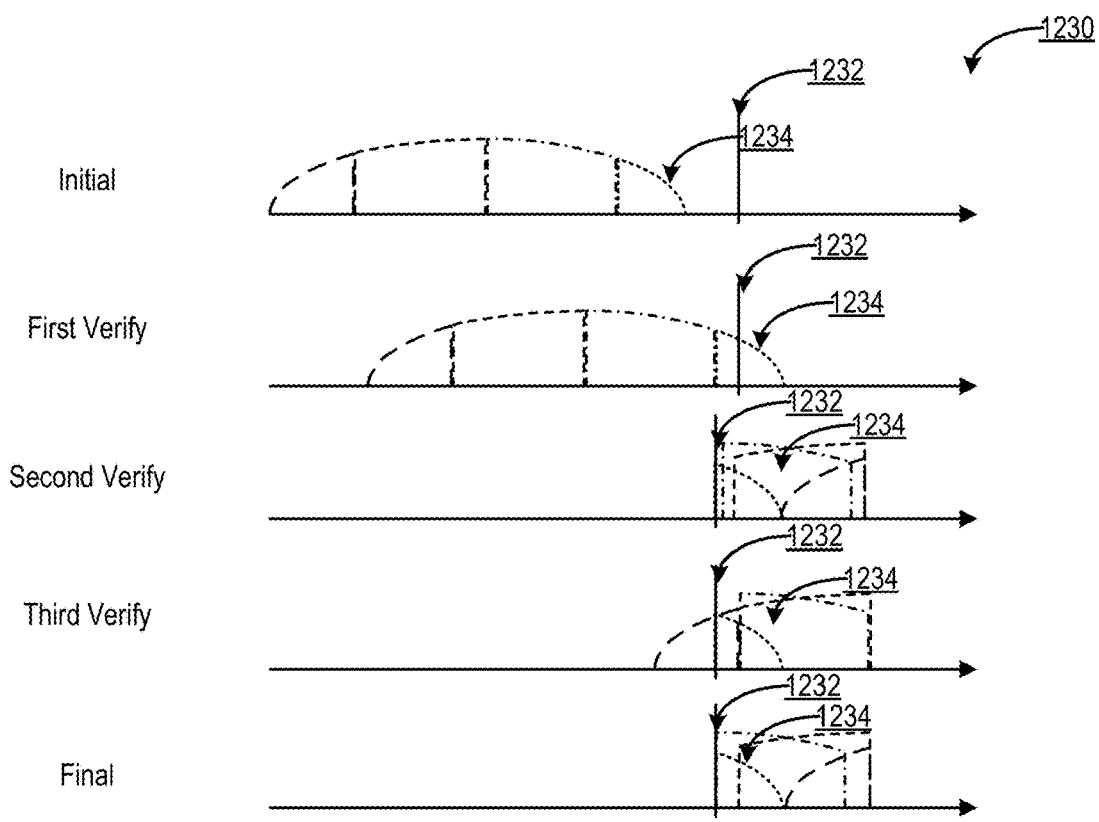

FIG. 12B depicts an example scenario 1230 involving adjustment of a verify high target voltage 1232 for a first program loop of a programming sequence that includes fast bits 1234 at an upper tail of a normal voltage distribution. Compared to the example scenario 1200 of FIG. 12A, the example scenario 1230 involves a portion of the fast bits 1234 passing the verify high target voltage 1232. In an initial program loop of the programming sequence, no programming operations or verify operations have been performed on the bits associated with the normal voltage distribution. In a first program loop of the programming sequence, a first verify operation involving a verify high target voltage 1232 is performed on memory cells on which a portion of the fast bits 1234 have been programmed. Following the first program loop, the verify high target voltage 1232 is raised. In the second program loop of the programming sequence, a second verify operation involving the raised verify high target voltage 1232 is performed on memory cells of a second set of bits, which involves a remainder of the fast bits 1234. In the third program loop of the programming sequence, a third verify operation involving the raised verify high target voltage 1232 is performed on memory cells of a third set of bits. In the fourth, or final program loop of the programming sequence, a fourth verify operation involving the raised verify high target voltage 1232 is performed on memory cells of a fourth set of bits, which can include the slow bits of the normal voltage distribution. As illustrated in FIG. 12B, in scenarios where a portion of the fast bits 1234 pass the verify high target voltage 1232, the portion of the fast bits 1234 remain near the lower tail of a final voltage distribution. Thus, the data retention effect is not sufficiently counteracted in this scenario.

Figure 12C:
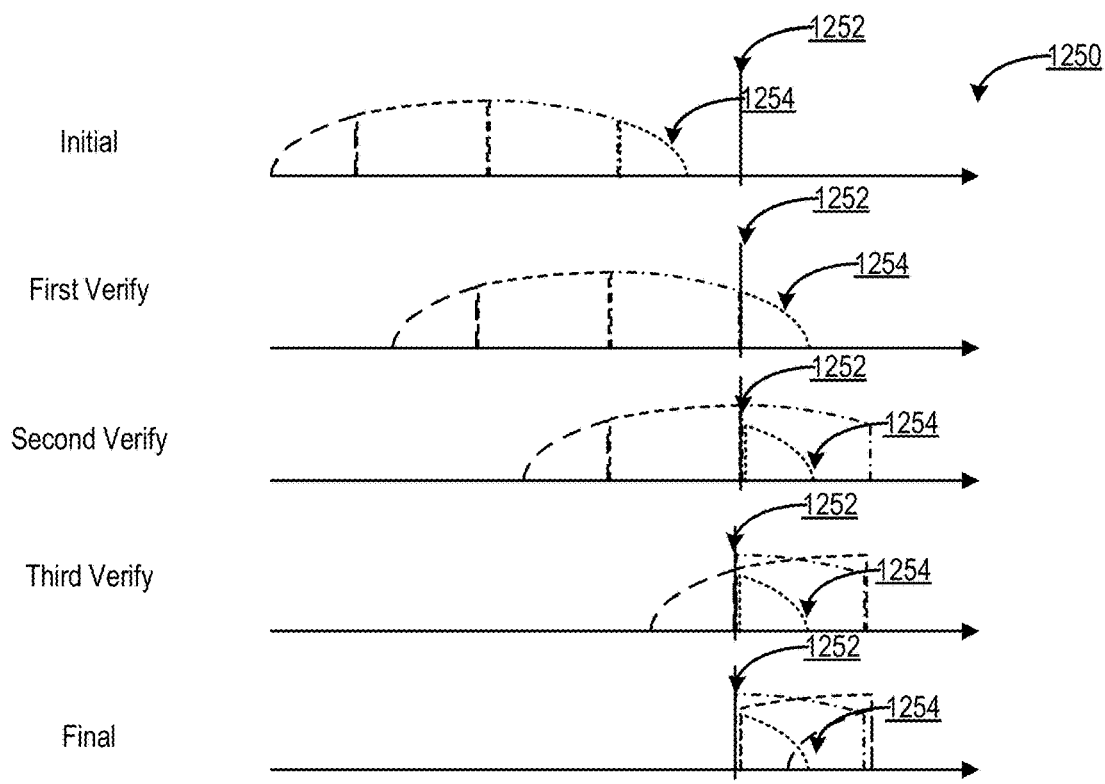

FIG. 12C depicts an example scenario 1250 involving adjustment of a verify high target voltage 1252 for a first program loop of a programming sequence that includes fast bits 1254 at an upper tail of a normal voltage distribution. Compared to the example scenario 1200 of FIG. 12A, the example scenario 1250 involves only adjusting the target voltage 1252 for one program loop. In an initial program loop of the programming sequence, no programming operations or verify operations have been performed on the bits associated with the normal voltage distribution. In a first program loop of the programming sequence, a first verify operation involving a verify high target voltage 1252 is performed on memory cells on which the fast bits 1254 have been programmed. Following the first program loop, the verify high target voltage 1252 is raised. In the second program loop of the programming sequence, a second verify operation involving the raised verify high target voltage 1252 is performed on memory cells of a second set of bits. In the third program loop of the programming sequence, a third verify operation involving the raised verify high target voltage 1252 is performed on memory cells of a third set of bits. In the fourth, or final program loop of the programming sequence, a fourth verify operation involving the raised verify high target voltage 1252 is performed on memory cells of a fourth set of bits, which can include the slow bits of the normal voltage distribution. As illustrated in FIG. 12C, in scenarios where the verify high target voltage 1232 is not adjusted with each program loop, the fast bits 1254 remain near the lower tail of a final voltage distribution. Thus, the data retention effect is not sufficiently counteracted in this scenario.

Figure 12D:
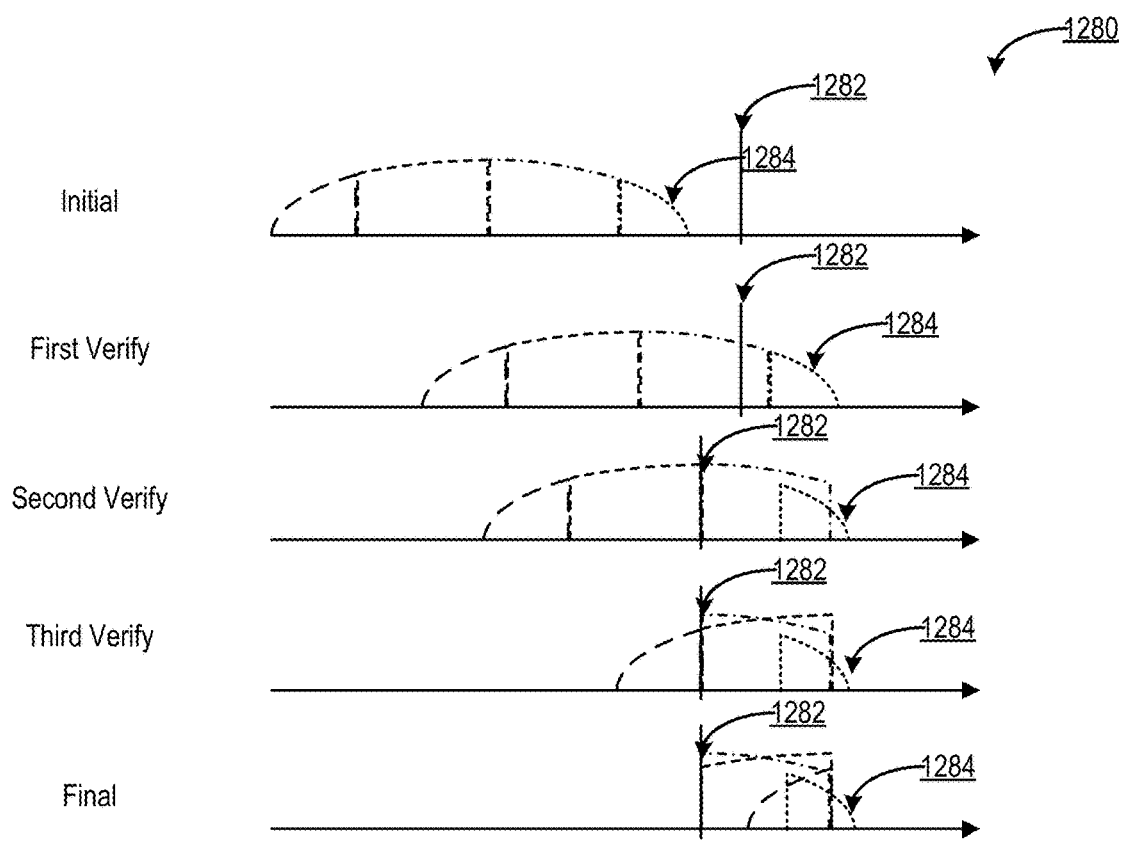

FIG. 12D depicts an example scenario 1280 involving adjustment of a verify high target voltage 1282 for a first program loop of a programming sequence that includes fast bits 1284 at an upper tail of a normal voltage distribution. Compared to the example scenario 1200 of FIG. 12A, the example scenario 1280 involves the fast bits 1284 and additional bits passing the verify high target voltage 1282. In an initial program loop of the programming sequence, no programming operations or verify operations have been performed on the bits associated with the normal voltage distribution. In a first program loop of the programming sequence, a first verify operation involving a verify high target voltage 1282 is performed on memory cells on which the fast bits 1284 and additional bits have been programmed. Following the first program loop, the verify high target voltage 1282 is raised. In the second program loop of the programming sequence, a second verify operation involving the raised verify high target voltage 1282 is performed on memory cells of a second set of bits. In the third program loop of the programming sequence, a third verify operation involving the raised verify high target voltage 1282 is performed on memory cells of a third set of bits. In the fourth, or final program loop of the programming sequence, a fourth verify operation involving the raised verify high target voltage 1282 is performed on memory cells of a fourth set of bits, which can include the slow bits of the normal voltage distribution. As illustrated in FIG. 12D, in scenarios where bits in addition to the fast bits 1284 pass the verify high target voltage 1282, the fast bits 1282 are adjusted beyond the upper tail of a final voltage distribution with the effect of widening the final voltage distribution. Thus, programming errors due to a widening of a final voltage distribution are not avoided in this scenario.

The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

It is intended that the foregoing be understood as an illustration of selected forms that the invention can take and not as a definition of the invention. Finally, it should be noted that any aspect of any of the preferred embodiments described herein can be used alone or in combination with one another.

What is claimed is:

1. A method comprising:
performing a programming operation for a set of memory cells to store a set of bits in the memory cells; and
performing verify operations for the set of memory cells, wherein the verify operations comprise:
a first verify operation for the set of memory cells based on memory cell voltages for the set of memory cells and a verify high voltage threshold, wherein the programming operation is determined to be completed if at least one of the memory cell voltages satisfy the verify high voltage threshold; and
an application of a bit line voltage to a memory cell of the set of memory cells based on a memory cell voltage associated with the memory cell and a target voltage threshold, wherein the bit line voltage is applied to the memory cell if the memory cell voltage associated with the memory cell fails to satisfy the target voltage threshold.

2. The method of claim 1, further comprising:
performing a subsequent programming operation for a subsequent set of memory cells; and
performing subsequent verify operations for the subsequent set of memory cells, wherein the subsequent verify operations comprise:
the first verify operation for the subsequent set of memory cells based on memory cell voltages for the subsequent set of memory cells and the verify high voltage threshold; and
a second verify operation for the subsequent set of memory cells based on the memory cell voltages for the subsequent set of memory cells and a verify low voltage threshold.

3. The method of claim 2, wherein the bit line voltage is not applied to the memory cell if the memory cell voltage associated with the memory cell satisfies the target voltage threshold, and the second verify operation is not performed until at least one application of the bit line voltage to at least one memory cell.

4. The method of claim 2, wherein the second verify operation replaces the determining the application of the bit line voltage in the verify operations performed for the set of memory cells.

5. The method of claim 1, wherein the programming operation and the verify operations are associated with a program loop of a programming sequence, and wherein the determining the application of the bit line voltage is performed for only one program loop of the programming sequence.

6. The method of claim 1, wherein the determining the application of the bit line voltage is performed on memory cells associated with fast bits of a programming sequence, and wherein the fast bits of the programming sequence are upshifted based on the application of the bit line voltage.

7. The method of claim 1, wherein the target voltage threshold is based on a middle of a voltage distribution associated with a programming sequence, and wherein the bit line voltage is based on a voltage that upshifts fast bits of the programming from a lower tail of the voltage distribution to an upper tail of the voltage distribution.

8. The method of claim 1, wherein the first verify operation is associated with a completion of the programming operation for the set of memory cells, wherein the set of memory cells includes a first subset of memory cells with memory voltages that satisfy the target voltage threshold and a second subset of memory cells with memory voltages that fail to satisfy the target voltage threshold, and wherein the application of the bit line voltage is performed on the second subset of memory cells.

9. A memory system, comprising:
an array of memory cells; and
control circuitry associated with control code, wherein the control code causes the control circuitry to perform:
a programming operation, by one or more read/write circuits, for a set of memory cells of the array of memory cells to store a set of bits in the set of memory cells; and
verify operations, by one or more sense amplifiers, for the set of memory cells, wherein the verify operations comprise:
a first verify operation for the set of memory cells based on memory cell voltages for the set of memory cells and a verify high voltage threshold, wherein the programming operation is determined to be completed if at least one of the memory cell voltages satisfy the verify high voltage threshold; and
subsequent to the first verify operation, an application of a bit line voltage to a memory cell of the set of memory cells based on a memory cell voltage associated with the memory cell and a target voltage threshold, wherein the bit line voltage is applied to the memory cell if the memory cell voltage associated with the memory cell fails to satisfy the target voltage threshold.

10. The memory system of claim 9, wherein the control circuitry further performs:
performing a subsequent programming operation for a subsequent set of memory cells; and
performing subsequent verify operations for the subsequent set of memory cells, wherein the subsequent verify operations comprise:
performing the first verify operation for the subsequent set of memory cells based on memory cell voltages for the subsequent set of memory cells and the verify high voltage threshold; and
performing a second verify operation for the subsequent set of memory cells based on the memory cell voltages for the subsequent set of memory cells and a verify low voltage threshold.

11. The memory system of claim 10, wherein the bit line voltage is not applied to the memory cell if the memory cell voltage associated with the memory cell satisfies the target voltage threshold, and the second verify operation is not performed until at least one application of the bit line voltage to at least one memory cell.

12. The memory system of claim 9, wherein the programming operation and the verify operations are associated with a program loop of a programming sequence, and wherein the determining the application of the bit line voltage is performed for only one program loop of the programming sequence.

13. The memory system of claim 9, wherein the determining the application of the bit line voltage is performed on memory cells associated with fast bits of a programming sequence, and wherein the fast bits of the programming sequence are upshifted based on the application of the bit line voltage.

14. The memory system of claim 9, wherein the target voltage threshold is based on a middle of a voltage distribution associated with a programming sequence, and wherein the bit line voltage is based on a voltage that upshifts fast bits of the programming sequence from a lower tail of the voltage distribution to an upper tail of the voltage distribution.

15. The memory system of claim 9, wherein the first verify operation is associated with a completion of the programming operation for the set of memory cells, wherein the set of memory cells includes a first subset of memory cells with memory voltages that satisfy the target voltage threshold and a second subset of memory cells with memory voltages that fail to satisfy the target voltage threshold, and wherein the application of the bit line voltage is performed on the second subset of memory cells.

16. A control circuit for performing memory operations on a memory structure, wherein the control circuit is programmable to perform:
- a programming sequence for a set of memory cells, wherein a programming operation associated with the programming sequence stores a set of bits, including fast bits, in the memory cells; and
- verify operations for the set of memory cells, wherein the verify operations comprise:
  - a first verify operation for the set of memory cells based on memory cell voltages for the set of memory cells and a verify high voltage threshold, wherein the programming operation is determined to be completed if at least one of the memory cell voltages satisfy the verify high voltage threshold; and
  - an application of a bit line voltage to a memory cell associated with the fast bits based on a memory cell voltage associated with the memory cell and a target voltage threshold, wherein the bit line voltage is applied to the memory cell if the memory cell voltage associated with the memory cell fails to satisfy the target voltage threshold.

17. The control circuit of claim 16, wherein the control circuit is programmable to further perform:
- performing a subsequent programming operation for a subsequent set of memory cells; and
- performing subsequent verify operations for the subsequent set of memory cells, wherein the subsequent verify operations comprise:
  - performing the first verify operation for the subsequent set of memory cells based on memory cell voltages for the subsequent set of memory cells and the verify high voltage threshold; and
  - performing a second verify operation for the subsequent set of memory cells based on the memory cell voltages for the subsequent set of memory cells and a verify low voltage threshold.

18. The control circuit of claim 16, wherein the programming operation and the verify operations are associated with a program loop of the programming sequence, and wherein the determining the application of the bit line voltage is performed for only one program loop of the programming sequence.

19. The control circuit of claim 16, wherein the target voltage threshold is based on a middle of a voltage distribution associated with the programming sequence, and wherein the bit line voltage is based on a voltage that upshifts the fast bits of the programming sequence from a lower tail of the voltage distribution to an upper tail of the voltage distribution.

20. The control circuit of claim 16, wherein the first verify operation is associated with a completion of the programming operation for the set of memory cells, wherein the set of memory cells includes a first subset of memory cells with memory voltages that satisfy the target voltage threshold and a second subset of memory cells with memory voltages that fail to satisfy the target voltage threshold, and wherein the application of the bit line voltage is performed on the second subset of memory cells.

\* \* \* \* \*